(12) United States Patent
Ehsan et al.

(10) Patent No.: US 11,742,151 B2
(45) Date of Patent: Aug. 29, 2023

(54) AEROSOL ASSISTED CHEMICAL VAPOR DEPOSITION METHODS USEFUL FOR MAKING DYE-SENSITIZED SOLAR CELLS WITH PLATINUM DIALKYLDITHIOCARBAMATE COMPLEXES

(71) Applicant: King Fahd University of Petroleum and Minerals, Dhahran (SA)

(72) Inventors: Muhammad Ali Ehsan, Dhahran (SA); Abdul Rehman, Dhahran (SA); Abbas Saeed Hakeem, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

(21) Appl. No.: 16/425,621

(22) Filed: May 29, 2019

(65) Prior Publication Data

US 2020/0381186 A1  Dec. 3, 2020

(51) Int. Cl.
| | |
|---|---|
| *C23C 16/06* | (2006.01) |
| *H01G 9/20* | (2006.01) |
| *H01G 9/00* | (2006.01) |
| *C23C 16/448* | (2006.01) |
| *C03C 17/09* | (2006.01) |

(52) U.S. Cl.
CPC ........... *H01G 9/2022* (2013.01); *C03C 17/09* (2013.01); *C23C 16/06* (2013.01); *C23C 16/4486* (2013.01); *H01G 9/0029* (2013.01); *H01G 9/2036* (2013.01); *H01G 9/2059* (2013.01); *C03C 2217/254* (2013.01); *C03C 2218/152* (2013.01)

(58) Field of Classification Search
CPC .............................. C23C 16/06; C23C 16/4486
See application file for complete search history.

(56) References Cited

U.S. PATENT DOCUMENTS

| | | | | |
|---|---|---|---|---|
| 5,278,121 A | * | 1/1994 | Singhal | B01J 27/045 502/162 |
| 7,579,251 B2 | | 8/2009 | Imanaka et al. | |
| 8,911,827 B2 | | 12/2014 | Suzuki et al. | |
| 10,494,394 B1 | * | 12/2019 | Isab | A61P 35/00 |
| 11,117,912 B1 | * | 9/2021 | Sulaiman | C07F 15/0086 |
| 2006/0060998 A1 | * | 3/2006 | Strouse | C01G 3/00 264/489 |
| 2015/0191835 A1 | * | 7/2015 | Khdary | C25B 11/059 502/262 |
| 2016/0145741 A1 | * | 5/2016 | Miki Yoshida | C23C 16/4486 427/252 |
| 2018/0174763 A1 | * | 6/2018 | Takayasu | H01G 9/2068 |

FOREIGN PATENT DOCUMENTS

| | | |
|---|---|---|
| EP | 2 915 784 A1 | 9/2015 |
| JP | 2005-109017 | 4/2005 |

OTHER PUBLICATIONS

Schlupp, Meike V., et al., "Platinum Thin-Film Electrodes Prepared by a Cost-Effective Chemical Vapor Deposition Technique". Advanced Engineering Materials 2016, 18, No. 7, pp. 1200-1207.*
Keter, Frankline K., et al., "N-heterocyclic dithiocarbamate platinum(II) complexes: Unexpected transformation of dithiocarbamate to oxodithiocarbonate in phosphinoplatinum complexes in solution". Inorganic Chemistry Communications 27 (2013) 60-63.*
Amir, Muhammad Kashif, et al., "Monofunctional platinum(II) dithiocarbamate complexes: synthesis, characterization and anticancer activity". RSC Adv., 2016, 6, 110517-110524.*
Dryden, Neil H., et al., "Chemical Vapor Deposition of Platinum: New Precursors and Their Properties". Chem. Mater. 1991, 3, 677-685.*
Uivarosi, Valentina, et al., "Thermal and spectral studies of palladium(II) and platinum(IV) complexes with dithiocarbamate derivatives". J Therm Anal Calorim (2013) 111:1177-1182.*
Ehsan, Muhammad Ali, et al., "Synthesis and utilization of platinum(II) dialkyldithiocarbamate precursors in aerosol assisted chemical vapor deposition of platinum thin films as counter electrodes for dye-sensitized solar cells". Polyhedron 166 (2019) 186-195.*
Tan, Yee Seng, "Dithiocarbamate Complexes of Platinum Group Metals: Structural Aspects and Applications". Inorganics, 2021, (9) 60, pp. 1-41.*
Imran, Muhammad, et al., "Two newmonofunctional platinum(II) dithiocarbamate complexes: phenanthriplatin-type axial protection, equatorial-axial conformational isomerism, and anticancer and DNA binding studies". Dalton Transactions, 2020, 49, 15385-15396.*
Ehsan, et al. ; Vysotskite structured photoactive palladium sulphide thin films from dithiocarbamate derivatives† ; New J. Chem 38 ; May 27, 2014 ; 9 Pages.
Paschos, et al. ; Synthesis of platinum nanoparticles by aerosol assisted deposition method ; Thin Solid Films, vol. 516, Issue 12 ; Jun. 20, 2007 ; pp. 3796-3801 ; 6 Pages.
Ling, et al. ; Gas-phase synthesis of hybrid nanostructured materials; Nanoscale, Issue 48 ; 2008 ; 21 Pages.
Moniz, et al. ; A novel route to Pt—Bi₂O composite thin films and their application in photo-reduction of water; Inorganica Chimica Acta, vol. 380 ; Jan. 15, 2012 ; pp. 328-335 ; 16 Pages.
Schlupp, et al. ; Platinum Thin-Film Electrodes Prepared by a Cost-Effective Chemical Vapor Deposition Technique** ; Advanced Engineering Materials 2016 ; vol. 18, No. 7 ; 8 pgaes.

* cited by examiner

*Primary Examiner* — Bret P Chen
(74) *Attorney, Agent, or Firm* — Oblon, McClelland, Maier & Neustadt, L.L.P.

(57) ABSTRACT

Platinum films can be obtained by aerosol assisted chemical vapor deposition (AACVD) using one or more Pt-dialkyl-dithiocarbamate complexes of formula $Pt(S_2CNR_2)$, wherein R is independently alkyl, aryl, or alkaryl, particularly as single source precursors. Such methods may include heating a substrate to a deposition temperature above 150° C. in a reactor; and introducing into the reactor, at the deposition temperature, an aerosol including a platinum dithiocarbamate compound, salt, and/or solvate thereof, to thereby deposit the platinum layer on the substrate. The $Pt(S_2CNR_2)$-derived films have well-connected and defect-free surface topography and better catalytic performance, likely due to their high conductivity and reflectivity.

20 Claims, 20 Drawing Sheets

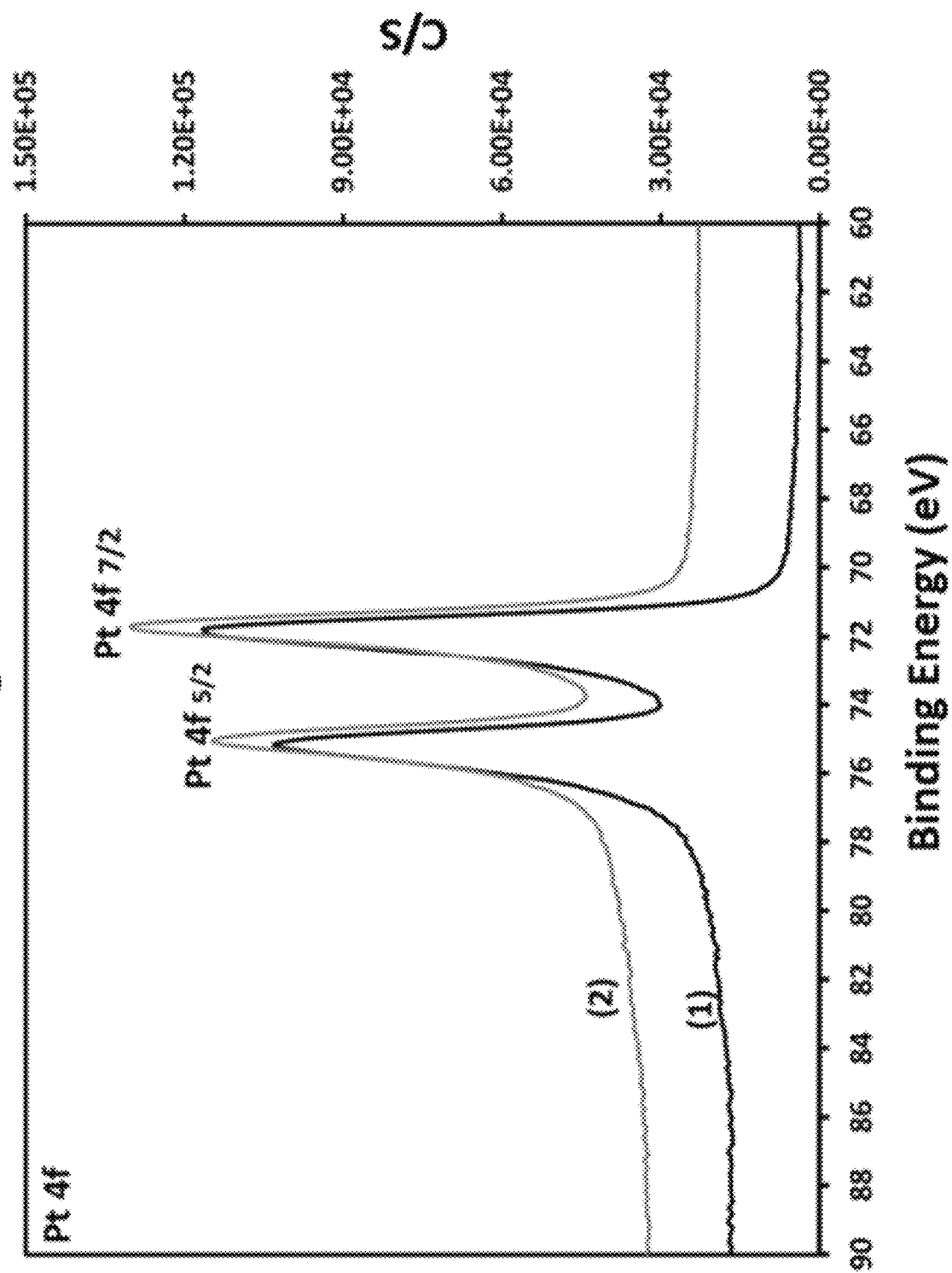

AEROSOL ASSISTED CHEMICAL VAPOR DEPOSITION METHODS USEFUL FOR MAKING DYE-SENSITIZED SOLAR CELLS WITH PLATINUM DIALKYLDITHIOCARBAMATE COMPLEXES

STATEMENT OF ACKNOWLEDGEMENT

The inventors gratefully acknowledge the research units at CENT-KFUPM and the support by the Deanship of Scientific Research at King Fahd University of Petroleum and Minerals, Saudi Arabia, for funding this work (Grant No. IN171005).

STATEMENT REGARDING PRIOR DISCLOSURES BY INVENTOR(S)

Aspects of the present disclosure are described in "Synthesis and utilization of platinum(II) dialkyldithiocarbamate precursors in aerosol assisted chemical vapor deposition of platinum thin films as counter electrodes for dye-sensitized solar cells," which was authored by the inventors and published online in *Polyhedron* 2019, 166, 186-195, on Apr. 6, 2019, which is incorporated herein by reference in its entirety.

BACKGROUND OF THE INVENTION

Field of the Invention

The present disclosure relates to platinum compounds or complexes which are particularly useful aerosol or vapor precursors for coating techniques, such as aerosol assisted chemical vapor deposition (AACVD), and for applications such as in dye-sensitized solar cells (DSSC).

Description of the Related Art

Facile fabrication of thin metal films has been a topic of research for a wide range of applications. Platinum (Pt), for example, has many interesting applications in thin film electrodes due to its electrical resistivity of ~10.5 $\mu\Omega \cdot cm$ at ambient temperatures, work function of 5.7 eV, melting point of 1772° C., high catalytic activity, and excellent chemical stability both in oxidizing and corrosive media. Applications of Pt include uses as electrodes in microelectronic and nanoelectronic devices, electrochemical sensors and biosensors, photo or electrochemical water splitting reactions, fuel cells based on proton exchange membranes as well as solid oxides, and as dye sensitized solar cells (DSSC). For all such electrode systems, Pt has to be coated on a variety of substrates utilizing different deposition techniques, during which, the morphology, microstructure, and interface of Pt with the substrate must be improved.

The tool box for scientists making Pt coatings and related materials includes two main strategies. One of these strategies is physical vapor deposition (PVD) using pure metal sources to form thin films by magnetron sputtering or e-beam evaporation. The other main strategy involves high temperature pyrolysis, electrochemical deposition, electroless deposition, or chemical vapor deposition of metal precursors. However, there are certain limitations for each of these commonly used deposition methodologies which must be overcome to improve performance of the resulting electrodes.

Morphological stability in deposited films is generally a significant issue. Although the bulk material may have a high melting point, the morphological stability of nano-sized Pt-films at elevated temperatures is often poor. Consequently, solid-state dewetting and agglomeration in thin-films can occur, leading to higher resistivity and lower catalytic activity. Furthermore, some deposition processes can cause agglomeration.

Inter-atomic interactions between individual metal atoms in cases of agglomeration are higher than the interactions between metal and substrate. Such an interaction disparity can initiate 3-D island formation. Beyond this, high vacuum and high power are needed for depositions of pure metal using either magnetron sputtering or e-beam evaporation, owing to the high melting point of Pt. Such vacuum and power demands can increase the cost substantially. Radiation damage of the substrates often results from such depositions as well.

In contrast, electrochemical methods require a conductive, non-corrosive substrate in the electrolytic environment. For electroless depositions, a layer of active metal must be coated on the substrate before the actual deposition. Still, electrochemically-produced electrodes demonstrate inferior photovoltaic signals in comparison to electrodes made by CVD or pyrolysis. Even in case of CVD, the tuning of thin films in relation to particle size, crystal structure, crystal orientation, porosity, and stress is necessary to improve performance. Therefore, new and simplified approaches of metal deposition addressing these problems would have an impact both on the applicability of metal films and processing costs of deposition.

One approach to addressing the above problems is using aerosol assisted chemical vapor deposition (AACVD) to grow thin Pt films. AACVD is a technique conventionally used to generate metal oxide films. However, AACVD can also be applied to grow noble metal films, due to their low reactivity, if an appropriate precursor can be designed and utilized as an aerosol. The AACVD process occurs at moderately high temperatures, i.e., 300 to 600° C., under ambient pressure conditions, making it industrially viable and scalable. Further, AACVD can form coherent thin films even up to micrometer thicknesses without agglomeration, as a result of the low sticking coefficients from the higher kinetic energies and higher densities of Pt-nuclei. Appropriate precursors are required which are capable of (gaseous/aerosol) transport to a reaction zone for AACVD, though precursor selection is more flexible in regard to vapor pressure and thermal stability. To control the morphology of the resulting films, the homogeneity and size of precursor aerosol droplets must be tuned. Film morphology can be tuned by adjusting either or both of the frequency of the aerosol generator, and the viscosity of the precursor solution. Adjusting frequency and/or viscosity can allow access to films of a controlled structure.

The particle growth and sintering processes simultaneously occur directly on the surface of the substrate, instigating interconnected morphological features and adhesive films of the metal. Interconnecting properties of such coatings are characterized by a particle-particle or particle-substrate connection enhancing the conductivity of thin films. Enhanced photocatalytic or catalytic performance can result from improved charge transport properties in the resulting electrodes. A significant requirement to accomplish appropriate interactions via AACVD is an adequately soluble metal-organic precursor, preferably using organic solvents. Obtaining such precursors, particularly with low temperature decomposition profiles (which may otherwise be deemed unsuitable for other conventionally used deposition procedures), is a challenge facing present AACVD research. Several such efforts are known.

EP 2 915 784 A1 by Miki Yoshida et al. (Miki Yoshida) discloses coating glass for architectural or automotive use, either monolithic or laminated, having solar control properties. Miki Yoshida's coating consists of at least two layers of different metal oxide semiconductors ($TiO_2$, ZnO, $ZrO_2$, $SnO_2$, $AlO_x$) and a layer of metallic nanoparticles (Au, Ag, Pt, and/or Pd), which when superimposed on a pre-established order give the glass solar control properties. Miki Yoshida's method includes coating by AACVD, using precursor solutions containing an organic or inorganic salt (acetates, acetylacetonates, halides, nitrates) of the applicable elements and an appropriate solvent (water, alcohol, acetone, acetylacetone, etc.). Miki Yoshida's syntheses are at temperatures from 100 to 600° C. depending on the deposition material using a nebulizer convert the precursor solution into an aerosol which flows with a gas to the substrate surface for thermal decomposition and coating. Miki Yoshida does not disclose AACVD for preparing a thin film of platinum deposited on FTO conductive glass substrate, nor platinum dithiocarbamate precursors. Moreover, Miki Yoshida exemplifies only Au or Ag layers with thicknesses of less than 100 nm.

U.S. Pat. No. 8,911,827 to Suzuki et al. (Suzuki) discloses a platinum or platinum compound thin film made by chemical vapor deposition of an organoplatinum compound which is an $\eta^2$, $\eta^2$ platinum 1,5-hexadiene compound, with a central platinum atom divalently coordinating a hexadiene with its 2 and/or 5 positions substituted by H, $R_1$, or $R_2$, and two alkyl anions, $R_3$ and $R_4$, further coordinated to the platinum atom. $R_1$ and $R_2$ are independently an alkyl group preferably methyl, ethyl, or propyl, and $R_3$ and $R_4$ are independently a hydrogen atom or an alkyl group, preferably methyl. Suzuki's organoplatinum compound is stable, generates no toxic substance in film formation, has a high vapor pressure, enables film formation at a low temperature, and is useful as a CVD raw material for forming a film. Suzuki also mentions using bis-(acetylacetonato) platinum(II), cyclopentadienyl trimethylplatinum(IV), and tetrakis(trifluorophosphine) platinum(0), but warns of premature thermal decomposition, failure to form films, or toxicity. Suzuki does not disclose any thiocarbamates nor FTO conducting glass, and Suzuki's Pt-layers are 100 nm thick.

U.S. Pat. No. 7,579,251 to Imanaka et al. (Imanaka I) discloses a circuit substrate including a passive element and an interconnection pattern, wherein the passive element and/or the interconnection pattern is formed by an aerosol deposition process using an aerosol of a fine particle material. Imanaka I mentions that Ag, Au, Pt, Pd, Al, Cu, or their alloys are available for aerosol deposition (AD), but exemplifies only Cu and makes layers of several microns or more in thickness. Imanaka I uses AD to construct its circuit substrate, but does not disclose AACVD for preparing Pt films, nor Pt films deposited on FTO conductive glass substrates. Imanaka I does not describe a dithiocarbamate-comprising precursor for deposition, particularly not a complex comprising platinum and a dithiocarbamate ligand.

JP 2005-109017 A by Imanaka et al. (Imanaka II) discloses a capacitor element with increasable electric capacity, comprising (in order) a substrate, and a bottom electrode layer, a dielectric layer, and a top electrode layer formed. Imanaka II's dielectric layer is deposited by spraying a dielectric fine particle material and a conductive fine particle material, both in the form of aerosol. Imanaka II's dielectric material is $TiO_2$, MgO, $SiO_2$, AlN, $Al_2O_3$, or an oxide ceramic having a perovskite structure (similar to Imanaka I). Imanaka II's conductive material is a metal such as B, Ge, Si, Bi, Ti, Cr, Pt, Pd, In, Ru, Ni, Mo, Co, W, Ir, Al, Au, Cu, Au, an alloy, a conductive oxide, or the like. Air gaps may form in the fine particle deposition portion in Imanaka II's dielectric layer, and the air gaps are filled with resin. Imanaka II's conductive fine particle material is contained in the dielectric layer deposited by spraying the aerosolized dielectric fine particles, and Imanaka II's dielectric layer has a thickness of 0.3 µm to 300 µm, with each example using 30 µm. Imanaka II does not disclose depositing a platinum film on an FTO conductive glass substrate by AACVD, nor using a platinum thiocarbamate precursor.

*New J. Chem.* 2014, 38, 4083-PPP by Ehsan et al. (Ehsan) discloses palladium(II) dithiocarbamate complexes, i.e., [Pd($S_2CNBn_2$)$_2$]·(py), [Pd($S_2CNCy_2$)$_2$]·(py), [Pd($S_2CN$(n-hexyl)$_2$)$_2$], and [Pd($S_2CN$(MeCy)$_2$)$_2$], wherein py is pyridine, Bn is benzyl, Cy is cyclohexyl, and MeCy is methylcyclohexyl, as single source precursors (SSPs) for palladium sulfide (PdS) films. Ehsan's PdS films were deposited on FTO conducting glass substrates at 400, 450, and 500° C. by AACVD to give a deposit with a tetragonal structure and a 1:1 ratio of Pd:S. Ehsan describes that the shape and size of PdS crystallites and the texture of films depends on the deposition temperature and precursor used. However, Ehsan does not disclose using platinum, nor platinum complexes, nor preparing a Pt film on a glass substrate by AACVD. Ehsan discloses obtaining sulfided palladium films by AACVD at 400 to 500° C. using palladium dithiocarbamate precursors.

*Thin Solid Films* 2008, 516(12), 3796-3801 by Pachos et al. (Pachos) discloses an atmospheric pressure AACVD to grow oriented nanoparticles and thin continuous films of platinum on a variety of substrates for catalysis or proton exchange membrane fuel cells. Pachos synthesizes 4 nm to 78 nm Pt nanoparticles on Si, silicon dioxide coated Si substrates, and carbon nanotubes. Pachos describes that the size and density of the nanoparticles depended strongly on the precursor, carrier gas flow rate, and deposition time. Pachos's particles showed preferential orientation of (111) independently of substrate used. However, Pachos does not describe dithiocarbamate complexes, instead using $H_2PtCl_6$. Pachos coats at 460° C. with a carrier gas flow rate of 400, 500, 1000, 1500, and 2000 sccm for 10, 30, 45, or 60 minutes. Pachos produces discrete particulate coatings of particle sizes no greater than 78 nm, presumably corresponding to the maximum coating thickness, and Pachos's method yields pure single crystal Pt particle coatings with size in the range of 4 to 30 nm.

*Nanoscale* 2018, 48, 1-21 by Ling et al. (Ling) discloses nanoparticles of noble metals and their oxides for (photo) catalysis or electrocatalysis, loaded onto metal oxide supports to enhance performance due to strong metal-metal oxide or metal oxide-metal oxide interactions. Ling describes AACVD for making nanostructured films of noble metals/oxides, e.g., Au, Pt, Pd, Ru, PdO, or RuOx, or nanoparticles supported on $WO_3$ nanorod arrays. Ling reports that the nanoparticle size (1.6 to 7.3 nm) is directly controlled by the deposition time (0.5 to 36 minutes). Ling does not disclose FTO conductive glass substrate, nor directly depositing onto it, nor preparing Pt films by AACVD. Ling uses $H_2PtCl_6$, like Pachos, and fails to describe dithiocarbamates. Ling deposits Pt from $H_2PtCl_6$ at 350° C. and 300 sccm, and does not describe contiguous coatings of Pt, but instead nanoparticles of Pt.

*Inorg. Chim. Act.* 2012, 380, 328-335 by Moniz et al. (Moniz) discloses a precursor, [Bi(III)(dibenzoylmethane)$_3$]

2, for thin films of crystalline β-Bi₂O₃, and H₂PtCl₆·6H₂O for deposition of platinum nanoparticles, each via AACVD. Moniz's Pt—Bi₂O₃ films were co-deposited from a mixture of [Bi(dbm)₃]₂ and H₂PtCl₆·6H₂O. Introduction of Pt particles into β-Bi₂O₃ causes H₂ evolution during photolysis of H₂O over the composite material, according to Moniz, a property not found for Pt particles or β-Bi₂O₃ alone. Moniz does not disclose preparing Pt films by AACVD, nor FTO conductive glass substrates. Moreover, Moniz does not disclose thiocarbamate complexes.

In light of the above, a need remains for improved Pt layers and Pt-layered structures, particularly for photovoltaic devices, such as dye-sensitized solar cells (DSSC), and methods of Pt deposition or methods of making photovoltaic devices.

SUMMARY OF THE INVENTION

Aspects of the invention provide aerosol assisted chemical vapor deposition methods for depositing a platinum layer onto a substrate, the method comprising: heating the substrate to a deposition temperature above 150° C. in a reactor; and introducing, at the deposition temperature, into the reactor an aerosol comprising a platinum dithiocarbamate compound, salt, and/or solvate thereof, to thereby deposit the platinum layer on the substrate. Inventive methods may involve any permutation of the features described herein, in any combination, particularly the following The substrate may be a glass.

The platinum layer may have a thickness in a range of from 150 to 700 nm, preferably 190 to 350 nm.

The introducing may occur for a deposition time in a range of from 15 to 60 minutes.

The platinum dithiocarbamate compound may be of formula (Ia):

Pt(S₂CNR₂)₂       (Ia), wherein R may be independently hydrogen, alkyl, aryl, or alkaryl, and wherein the alkyl, aryl, or alkaryl may be optionally substituted.

The platinum dithiocarbamate compound may be of formula (Ib):

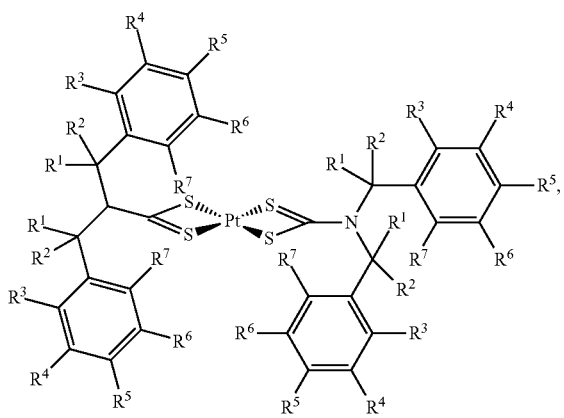

wherein R¹ and R² are independently hydrogen or C1 to C3 alkyl, and wherein R³ to R⁷ are independently hydrogen, C₀₋₃-alkyl-halide, C₁₋₅-alkyl, C₀₋₃-alkyl-alcohol, C₀₋₃-alkyl-thiol, C₀₋₃-alkyl-amine, C₀₋₃-alkyl-carboxylate, C₀₋₃-alkyl-nitrile, C₀₋₃-alkyl-thiocyanate, C₀₋₃-alkyl-isocyanate, C₀₋₃-alkyl-cyanate, C₀₋₃-alkyl-O—C₁₋₅-alkyl, C₀₋₃-alkyl-CO₂—C₁₋₅-alkyl, C₀₋₃-alkyl-O₂C—C₁₋₅-alkyl, C₀₋₃-alkyl-N—(C₁₋₅-alkyl)₂, C₀₋₃-alkyl-C(O)N—(C₁₋₅-alkyl)₂, C₀₋₃-alkyl-C(O)—C₁₋₅-alkyl, or C₀₋₃-alkyl-S—C₁₋₅-alkyl.

The deposition temperature may be in a range of 350 to 650° C., preferably 450 to 550° C.

The platinum layer may comprise at least 90 wt. % of elemental Pt, based on total deposition layer weight.

The introducing may comprise flowing the aerosol with an inert gas comprising N₂, Ar, He, and/or Ne, from an aerosolization vessel to the reactor.

The inert gas may be flowed through the deposition apparatus at a flow rate in a range of from 80 to 160 mL/minutes per 2 cm² of substrate surface.

Inventive methods may further comprising, prior to the introducing: aerosolizing a solution or suspension of the platinum dithiocarbamate in an organic solvent comprising at least 90 wt. % of an organic base, based on total solvent weight. A weight ratio of the platinum dithiocarbamate to the solvent in any solution/suspension may be in a range of from 25:1 to 250:1.

The platinum film may comprise at least partially fused platinum nanoparticles having average diameters in a range of from 5 to 100 nm uniformly distributed on a surface of the substrate.

Aspects of the invention include electrodes comprising: a substrate; and a platinum layer upon the substrate, wherein platinum layer has a thickness of in a range of 180 to 650 nm, and wherein the platinum layer comprises at least 95 wt. % elemental Pt, based upon a total weight of the platinum layer. The substrate may be a conductive FTO glass.

Aspects of the invention comprise dye-sensitized solar cells comprising any permutation of inventive electrode described herein as a counter electrode; an electrolyte layer; and a photoanode comprising an conductive FTO glass and a TiO₂ coating upon the FTO glass.

Aspects of the invention provide methods of producing electricity, comprising irradiating any permutation of inventive solar cell described herein with electromagnetic radiation.

Aspects of the invention include platinum complexes of formula (Ic), salts, or solvates thereof:

Pt(S₂CNR₂)₂       (Ic), wherein R is C2 to C5 alkyl, C5 to C10 aryl, or C6 to C11 alkaryl, wherein the alkyl, aryl, or alkaryl may be substituted by 1 or 2 fluoride, chloride, alcohol, amine, C1 to C2 ether, or nitrile.

Inventive complexes may have the structure Pt(S₂CN-i-Bu₂)₂ or Pt(S₂CNBn₂)₂, optionally as a pyridine solvate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 8 shows high resolution x-ray photoelectron spectroscopy (XPS) spectra of platinum thin films deposited from precursor [Pt($S_2$CN-i-$Bu_2$)$_2$] (1) and [Pt($S_2$CN$Bn_2$)$_2$]·py (2);

DETAILED DESCRIPTION OF THE PREFERRED EMBODIMENTS

Figure 1:
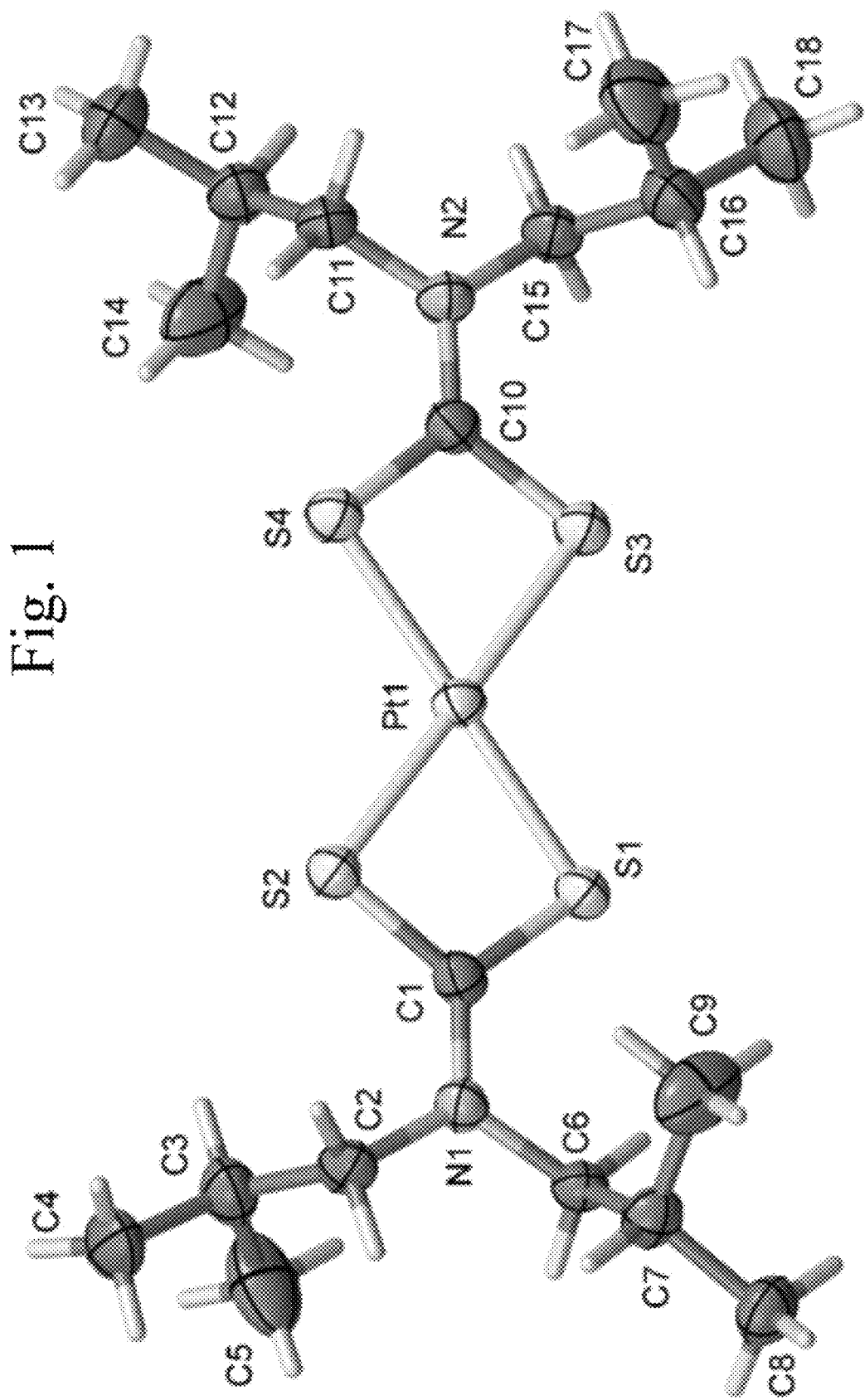
FIG. 1 shows a ball-and-stick molecular structure model of a Pt(S₂CN-i-Bu₂)₂ complex (1) with atom labeling, whereby the displacement ellipsoids are drawn at the 50% probability level.

Aspects of the invention provide aerosol assisted chemical vapor deposition methods for depositing a platinum layer onto a substrate, the method comprising: heating the substrate to a deposition temperature above 150° C. in a reactor; and introducing, at the deposition temperature, into the reactor an aerosol of a platinum dithiocarbamate compound, salt, and/or solvate thereof, to thereby deposit the platinum layer on the substrate. The deposition temperature may be, for example, at least 150, 175, 200, 225, 250, 275, 300, 325, 350, 375, 400, 415, 425, 435, 445, 450, 455, 460, 465, 470, 475, 480, 485, 490, 495, 500, 505, 510, 515, 525, 550, or 575° C. and/or up to 700, 675, 650, 625, 600, 575, 565, 550, 545, 540, 535, 530, 525, 520, 515, 510, 505, 500, 495, 490, 485, 475, or 450° C. The deposition temperature may be in a range of from 350 to 650° C., 400 to 600, 425 to 575, 450 to 550, 460 to 540, 470 to 520, 475 to 525, 480 to 520, 485 to 515, or 490 to 510° C.

The deposition temperature may be tailored to the particular platinum dithiocarbamate compound(s) used, the mixture of platinum compounds including at least one platinum dithiocarbamate (e.g., 1, 2, 3, 4 or more platinum dithiocarbamate, plus non-dithiocarbamate(s)), the reaction chamber volume/design, the carrier gas flow rate, and/or the deposition pressure (preferably ambient, though possibly under vacuum or overpressure). The reactor may be any substantially contained space suitable for deposition, and even more open spaces may be implemented, as long as appropriate heat and desired contamination control can be achieved.

The substrate may be a glass, such as a fluorine-doped $SnO_2$ glass, preferably conductive, a quartz glass, borosilicate glass, a polymer layer having a melting point above 300° C., diamond, ceramic (e.g., $Si_3N_4$ or similar nitrides, carbides, or borides), a metal, silicon, ZnSe, ZnS, Ge, GaAs, reaction-bonded SiC, or the like. The substrate generally should not require any particular surface treatment, e.g., no chemical or physical modification beyond cleaning. The cleaning may be achieved by solvent washing (e.g., water, acetone, methanol, ethanol, pentane, dichloromethane, etc., optionally with a surfactant), by sand blasting, by sonication in any suitable solvent, etc. Depending upon the intended application, the substrate may have a thickness of at least 0.1, 0.25, 0.33, 0.4, 0.5, 0.6, 0.75, 0.8, 0.9, 1, 1.25, 1.5, 1.75, 2, 2.5, 4, 5, 6, 7, 8, 10, 20, 24.8, 30, 40, 45, or 50 mm and/or up to 50, 45, 40, 35, 30, 25, 20, 17.5, 15, 12.5, 10, 8, 6, 5, 4, 3, 2, 1.5, 1, or 0.75 mm. The thickness of the substrate may also be tailored to the deposition surface area of the substrate, which may be, for example, at least 1, 1.5, 2, 2.5, 3, 4, 5, 6, 8, 9, 10, 20, 25, 50, 64, 81, 100, 125, 132, 144, 150, 169, 175, 200, 400, 900, or 1000 $cm^2$ and/or up to 20, 18, 16, 15, 14, 12, 10, 9, 8, 6, 5, 4, 3, 2.5, 2, 1.6, 1.2, 1, 0.9, 0.8, 0.5, 0.4, 0.36, 0.25, 0.16, 0.12, 0.1, 0.09, 0.08, 0.064, 0.05, 0.04, 0.036, 0.025, 0.016, 0.012, 0.01, 0.009, 0.008, 0.0064, 0.005, 0.004, 0.0036, 0.0025, 0.0016, 0.012, or 0.009 $m^2$. While certain applications may call for planar substrates, curved (e.g., half-pipe, spherical, hemispherical, sinusoidal, spiral, etc.), and irregular shapes may also be useful in the inventive methods. Substrates may be rectangular, square or elongated, circular, ovular, triangular, hexagonal, rod-shaped, cookie-cutter shaped (i.e., tailored for insertion into a premade device or host), or irregularly shaped.

The platinum layer may have a thickness in a range of from 150 to 700 nm, preferably 190 to 350 nm, depending on the application. For example, the thickness of the platinum layer may have any of these endpoints and/or at least 175, 185, 195, 200, 205, 210, 215, 220, 225, 230, 235, 240, 250, 265, 275, 285, 300, 315, 330, 350, 365, 375, 385, 400, 415, 425, 440, 450, 475, or 500 nm and/or up to 675, 650, 625, 600, 575, 550, 525, 500, 475, 460, 450, 440, 430, 425, 420, 415, 410, 405, 400, 395, 390, 385, 380, 375, 360, 350, 340, 325, 315, 305, 300, 295, 285, 275, or 265 nm.

The introducing, i.e., flowing of an aerosol into the reactor, may occur for a deposition time in a range of from 15 to 60 minutes, e.g., any of these endpoints and/or (at ambient pressure) at least 17.5, 18, 19, 20, 21, 22.5, 25, 27.5, or 30 minutes and/or up to 55, 50, 45, 40, 35, 32.5, 30, 27.5, 25, 24, 23, 22.5, 22, 21, or 20 minutes.

The platinum dithiocarbamate compound may be of formula (Ia):

$$Pt(S_2CNR_2)_2 \qquad\qquad (Ia),$$

wherein R may be independently hydrogen, alkyl, aryl, or alkaryl, and wherein the alkyl, aryl, or alkaryl may be optionally substituted. R as an alkyl group may take the form of a methyl, ethyl, C3 alkyl (e.g., propyl, iso-propyl, cyclopropyl), C4 alkyl (e.g., butyl, s-butyl, isobutyl, t-butyl, cyclobutyl), C4 alkyl (e.g., pentyl, isopentyl, s-pentyl, neopentyl, ethylenecyclopropyl, methylenecyclobutyl, cyclopentyl), C6 alkyl, C7 alkyl, C8 alkyl, C9 alkyl, C10 alkyl, or alkyl (fatty acid, oil, fatty alcohol) chains of C12 to C18. Aryl groups may include substituent forms of benzene (phenyl), pyrrole, imidazole, pyridine, naphthylene, guanidine, pyrazine, purine, indolizine, quinolizine, pyridazine, imidazole, indole, isoindole, naphthyridine, quinoline, isoquinoline, pyrrole, furan, thiophene, oxazole, isoxazole, thiazole, isothiazole, oxazines, carbazole and other benzofused and/or partially hydrogenated analogs of these, etc. Alkaryl substituents may combine any of the above alkyl groups with any of the above by covalent bonding, e.g., benzyl (phenylmethylene, phenylethylene, etc.). Any alkyl chains of these may be interrupted by 1, 2, 3, or more ether oxygens, sulfides, esters, amides, carbonyls, carbonates, sulfoxides, etc. For substituents, 1, 2, 3, 4, or 5 protons of any of the alkyl, aryl, and/or alkaryl may be replaced by an azide, amine, nitrile, isonitrile, cyanate, isocyanate, thiocyanate, isothiocyanate, nitro, nitroso, thiol, thioether, fluoride, chloride, bromide, iodide, methyl, ethyl, n-propyl, isopropyl, n-butyl, isobutyl, sec-butyl, methoxy ($OCH_3$), ethoxy ($OCH_2CH_3$), propoxy ($OCH_2CH_2CH_3$), isopropoxy ($OCH(CH_3)_2$), butoxy ($OCH_2CH_2CH_2CH_3$), isobutoxy, sec-butoxy, cyanate, methoxymethyl, methoxyethyl, ethoxymethyl, hydroxy, or C1, C2, C3, or C4 carboxylate, sulfonate, amide, ester, carbamate, sulfonamide, or ketone, either outward or reversed application, "reversed" in the context of, e.g., carbonyl compounds, meaning —$CH_2OC(O)CH_2$—, rather than —$CH_2C(O)OCH_2$—.

The platinum dithiocarbamate compound may be of formula (Ib):

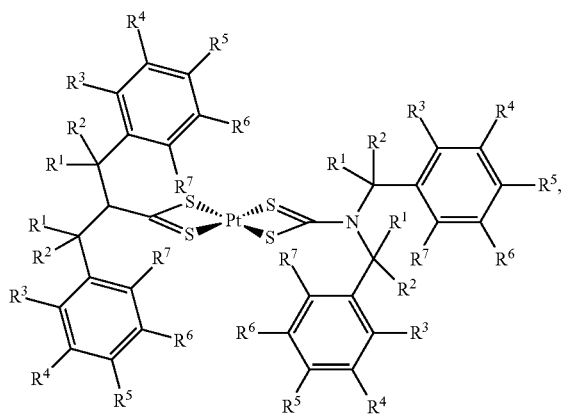

(Ib)

wherein $R^1$ and $R^2$ are independently hydrogen or C1 to C3 alkyl, and wherein $R^3$ to $R^7$ are independently hydrogen, $C_{0-3}$-alkyl-halide, $C_{1-5}$-alkyl, $C_{0-3}$-alkyl-alcohol, $C_{0-3}$-alkyl-thiol, $C_{0-3}$-alkyl-amine, $C_{0-3}$-alkyl-carboxylate, $C_{0-3}$-alkyl-nitrile, $C_{0-3}$-alkyl-thiocyanate, $C_{0-3}$-alkyl-isocyanate, $C_{0-3}$-alkyl-cyanate, $C_{0-3}$-alkyl-O—$C_{1-5}$-alkyl, $C_{0-3}$-alkyl-$CO_2$—$C_{1-5}$-alkyl, $C_{0-3}$-alkyl-$O_2C$—$C_{1-5}$-alkyl, $C_{0-3}$-alkyl-N—($C_{1-5}$-alkyl)$_2$, $C_{0-3}$-alkyl-C(O)N—($C_{1-5}$-alkyl)$_2$, $C_{0-3}$-alkyl-C(O)—$C_{1-5}$-alkyl, or $C_{0-3}$-alkyl-S—$C_{1-5}$-alkyl, wherein, e.g., "$C_{0-3}$-alkyl" means C0, C1, C2, or C3 alkyl, or having a no linker, a methylene, ethylene, propylene, isopropylene, etc., which maybe substituted. The same applies mutatis mutandis to "$C_{1-5}$-alkyl," i.e., C1, C2, C3, C4, or C5 alkyl. Preferably, $R^1$ and $R^2$ are independently hydrogen, and the phenyl group is unsubstituted or optionally substituted by 1 or 2 substituents mentioned above, esp. methyl, ethyl, hydroxyl, oxymethyl, or fluoride.

The platinum layer may comprise at least 90, 91, 92, 92.5, 93, 94, 95, 96, 97, 97.5, 98, 99, 99.1, 99.5, or 99.9 wt. % of elemental Pt, based on total deposition layer weight.

The introducing may comprise flowing the aerosol with an inert gas, i.e., carrier gas, comprising $N_2$, Ar, He, and/or Ne, from an aerosolization vessel (or space within the reactor) to the reactor (or reactor space within the reactor). For some applications, $CO_2$ may be used as a carrier or supplement. The inert gas may preferably avoid $O_2$ or reactive gases, though some applications may call for up to 25, 20, 15, 10, 7.5, 5, 4, 3, 2, 1, 0.5, 0.1, 0.001, 0.0001, or 0.00001 vol. % of $0_2$ and/or other reactive gases, relative to total carrier gas volume. Generally, the carrier gas will comprise at least 75, 80, 85, 90, 91, 92, 92.5, 93, 94, 95, 96, 97, 97.5, 98, 99, 99.1, 99.5, 99.9, 99.99, or 99.999 vol. % of a total carrier gas volume of $N_2$, Ar, He, and/or Ne.

The inert gas may be flowed through the deposition apparatus at a flow rate in a range of from 80 to 160 mL/minutes per 2 $cm^2$ of substrate surface (i.e., 40 to 80 mL/minutes per $cm^2$), e.g., any of these endpoints and/or at least 42.5, 45, 47.5, 50, 52.5, 55, 57.5, 60, 62.5, or 65 mL/minutes per $cm^2$ and/or up to 150, 125, 100, 95, 90, 85, 82.5, 77.5, 75, 72.5, 70, 67.5, 65, 62.5, 60, 57.5, 55, 52.5, or 50 mL/minutes per $cm^2$.

Inventive methods may further comprising, prior to the introducing: aerosolizing a solution or suspension of the platinum dithiocarbamate in an organic solvent comprising at least 90, 91, 92, 92.5, 93, 94, 95, 96, 97, 97.5, 98, 99, 99.1, 99.5, or 99.9 wt. % of an organic base, based on total solvent weight. The organic base may comprise pyridine, DABCO (1,4-diazabicyclo[2.2.2]octane), DBU (1,8-diazabicyclo[5.4.0]undec-7-ene), DBN (1,5-diazabicyclo[4.3.0]non-5-ene), piperidine, piperazine, triethylamine, diethylamine, propylamine, butylamine, ethylenediamine, benzylamine, aniline, 2-t-butyl-1,1,3,3-tetramethylguanidine, diisopropylamine, N,N-diisopropylmethylamine, 2,6-lutidine, morpholine, 1,5,7-triazabicyclo[4.4.0]dec-5-ene, histidine, and/or ethanolamine. A weight ratio of the platinum dithiocarbamate to the solvent in any solution/suspension may be in a range of from 25:1 to 250:1, e.g., any of these endpoints and/or at least 20:1, 22.5:1, 27.5:1, 30:1, 33:1, 35:1, 37.5:1, 40:1, 42.5:1, 45:1, 47.5:1, 50:1, 52.5:1, 55:1, 57.5:1, or 60:1 and/or up to 1000:1, 750:1, 625:1, 500:1, 400:1, 350:1, 333:1, 300:1, 275:1, 225:1, 200:1, 175:1, 150:1, 125:1, 100:1, 95:1, 90:1, 85:1, 80:1, 75:1, 72.5:1, 70:1, 67.5:1, or 65:1.

The platinum film may comprise at least partially fused platinum nanoparticles having average diameters in a range of from 5 to 100 nm uniformly distributed on a surface of the substrate. The fusing of the nanoparticles may leave a caterpillar-like to beaded-string-type appearance, in 1D (linear), 2D (planar), or 3D (x,y,z-spatial). The average platinum nanoparticle diameter may be, e.g., at least 5, 10, 15, 20, 25, 30, 35, 40, 45, or 50 nm and/or up to 100, 95, 90, 85, 80, 75, 70, 65, 60, 55, or 50 nm. Aspects of the invention include electrodes comprising: a substrate; and a platinum layer upon the substrate, wherein platinum layer has a thickness in a range of 180 to 650 nm, e.g., any thickness described above and/or depending upon the end use 177.5, 187.5, 197.5, 202.5, 207.5, 212.5, 217.5, 222.5, 227.5, 232.5, 237.5, 242.5, 252.5, 267.5, 277.5, 287.5, 302.5, 317.5, 332.5, 352.5, 367.5, 377.5, 387.5, 402.5, 417.5, 427.5, 442.5, 452.5, 477.5, or 502.5 nm and/or up to 672.5, 652.5, 627.5, 602.5, 577.5, 552.5, 527.5, 502.5, 477.5, 462.5, 452.5, 442.5, 432.5, 427.5, 422.5, 417.5, 412.5, 407.5, 402.5, 397.5, 392.5, 387.5, 382.5, 377.5, 362.5, 352.5, 342.5, 327.5, 317.5, 307.5, 302.5, 297.5, 287.5, 277.5, or 267.5 nm, and wherein the platinum layer comprises at least 95, 96, 97, 97.5, 98, 99, 99.1, 99.5, 99.9, 99.99, 99.999, or 99.9999 wt. % elemental Pt, based upon a total weight of the platinum layer. The substrate may preferably be a conductive FTO glass, though any substrate discussed herein may be used. Inventive electrodes may exclude further layers than the substrate and the Pt-layer, or may exclude further functional layers.

Aspects of the invention comprise dye-sensitized solar cells comprising any permutation of inventive electrode described herein as a counter electrode; an electrolyte layer; and a photoanode comprising an conductive FTO glass and a $TiO_2$ coating upon the FTO glass.

Aspects of the invention provide methods of producing electricity, comprising irradiating any permutation of inventive solar cell described herein with electromagnetic radiation. The electromagnetic radiation may preferably have a wavelength in a range of from 50 to 10000 nm, e.g., any of these endpoints and/or at least 75, 100, 125, 150, 175, 200, 210, 250, 275, 300, 350, 400, or 800 nm and/or up to 10000, 7500, 5000, 2500, 2000, 1750, 1500, 1250, 1000, 900, 800, 500, 400, 350, 300, 250, or 210 nm.

Aspects of the invention include platinum complexes of formula (Ic), salts, or solvates thereof:

$$Pt(S_2CNR_2)_2 \quad (Ic),$$

wherein R is C2 to C5 alkyl, C5 to C10 aryl, or C6 to C11 alkaryl, wherein the alkyl, aryl, or alkaryl may be substituted by 1 or 2 fluoride, chloride, alcohol, amine, C1 to C2 ether, or nitrile. Inventive complexes may have the structure $Pt(S_2CN-t-Bu_2)_2$, $Pt(S_2CN-n-Bu_2)_2$, $Pt(S_2CN-i-Bu_2)_2$, $Pt(S_2CN-i-Pr_2)_2$, $Pt(S_2CN-n-Pr_2)_2$, $Pt(S_2CN-Et_2)_2$, $Pt(S_2CN-Me_2)_2$, $Pt(S_2CN-n-Pr_2)_2$, or $Pt(S_2CNBn_2)_2$, $Pt(S_2CNPh_2)_2$, $Pt[S_2CN—(CH_2\text{-o-MePh})_2]_2$, $Pt[S_2CN—(CH_2\text{-m-MePh})_2]_2$, $Pt[S_2CN—(CH_2\text{-p-MePh})_2]_2$, $Pt[S_2CN—(CH_2\text{-o-FPh})_2]_2$, $Pt[S_2CN—(CH_2\text{-m-FPh})_2]_2$, $Pt[S_2CN—(CH_2\text{-p-FPh})_2]_2$, $Pt[S_2CN—(CH_2\text{-o-EtPh})_2]_2$, $Pt[S_2CN—(CH_2\text{-m-EtPh})_2]_2$, $Pt[S_2CN—(CH_2\text{-p-EtPh})_2]_2$, optionally as a pyridine (or any other organic base mentioned above) solvate. The "solvate," as used herein, may merely incorporate a solvent molecule into its crystal structure.

Inventive structures generally include only one fluoride-doped tin oxide (FTO), rather than 2, 3, or more different semiconductor metal oxide layers, e.g., $TiO_2$, ZnO, $ZrO_2$, $SnO_2$, and/or $Al_2O_3$, and an elemental platinum layer. Beyond the substrate, FTO, and Pt-layer, as well as optional photovoltaic semiconductor and optional dye layers, inventive structures need not contain further particulate and/or deposition layers (the Pt-layer may be the only AACVD and/or general deposition layer). Inventive structures may exclude copper films, Cu inductors, and/or Cu plating layers. Inventive structures generally have no layer (overlooking the substrate) with a thickness of at least 50, 40, 30, 25, 20, 15, 10, 7.5, 5, 4, 3, 2.5, 2, 1.5, or 1 μm.

Beyond glass substrates and FTO layers, inventive structures may exclude, contain only detectable traces of (i.e., residual contaminant), or may comprise no more than 15, 10, 7.5, 5, 4, 3, 2, 1, or 0.5 wt. %, relative to the total deposition layer weight, of $Al_2O_3$, MgO, $SiO_2$, CaO, $TiO_2$, $3Al_2O_3·2SiO_2$ (mullite), $MgO·Al_2O_3$ (spinel), $2MgO·SiO_2$ (forsterite), $2Al_2O_3·2MgO·5SiO_2$ (cordierite), $CaO·Al_2O_3·2SiO_2$ (anorthite), AlN, $BaTiO_3$, $BaSrTiO_3$, $BaTiZrO_3$, $BaTi_4O_9$, $Ba_2Ti_9O_{20}$, $Ba(Mg_{1/3}Ta_{2/3})O_3$, $Ba(Zn_{1/3}Ta_{2/3})O_3$, $Ba(Zn_{1/3}Nb_{2/3})O_3$, $ZrSnTiO_4$, $PbZrTiO_3$, $Pb(Mg_{1/3}Nb_{2/3})O_3$, $Pb(Ni_{1/3}Nb_{2/3})O_3$, $CaTiO_3$, $MgTiO_3$, and/or $SrTiO_3$, in combination(s) or individually.

Inventive structures may exclude, contain only detectable traces of (i.e., residual contaminant), or may comprise no more than 15, 10, 7.5, 5, 4, 3, 2, 1, or 0.5 wt. %, relative to the total deposition layer weight, of oxide ceramics having a perovskite structure, e.g., PZT and/or PLZT, including $PbTiO_3$, $PbZrO_3$, $Pb(Zr_{1-x}Ti_x)O_3$ (0≤x≤1), $(Pb_{1-y}La_y)(Zr_{1-x}Ti_x)O_3$ (0≤x, y≤1), $Pb(Mg_{1/3}Nb_{2/3})O_3$, $Pb(Ni_{1/3}Nb_{2/3})O_3$, and/or $Pb(Zn_{1/3}Nb_{2/3})O_3$, in combination(s) or individually.

Inventive structures may exclude, contain only detectable traces of (i.e., residual contaminant), or may comprise no more than 15, 10, 7.5, 5, 4, 3, 2, 1, or 0.5 wt. %, relative to the total deposition layer weight, of Ba-containing oxide ceramics, e.g., $BaTiO_3$, $BaTi_4O_9$, $Ba_2Ti_9O_{20}$, $Ba(Zn_{1/3}Ta_{2/3})O_3$, $Ba(Zn_{1/3}Nb_{2/3})O_3$, $Ba(Mg_{1/3}Ta_{2/3})O_3$, $Ba(Mg_{1/3}Ta_{2/3})O_3$, $Ba(Co_{1/3}Ta_{2/3})O_3$, $Ba(Co_{1/3}Nb_{2/3})O_3$, $Ba(Ni_{1/3}Ta_{2/3})O_3$, $Ba(Zr_{1-x}Ti_x)O_3$, and/or $(Ba_{1-x}Sr_x)TiO_3$, in combination(s) or individually.

Inventive structures may exclude, contain only detectable traces of (i.e., residual contaminant), or may comprise no more than 5, 4, 3, 2.5, 2, 1, 0.5, 0.1, 0.05, 0.01, or 0.001 wt. %, relative to the total structure weight or the total deposition layer weight, of aluminum, lead, and/or oxides thereof (e.g., Al, $Al_2O_3$, $LiAlO_2$, $MgAlO_4$, $CaAl_2O_4$, $SrAl_2O_4$, $BaAl_2O_4$, $Y_3Al_5O_{12}$, AlN, γ-AlOOH (boehmite), $Al(OH)_3$, $Al(OR)_3$ where R is alkyl, $2SiO_2$ (mullite), $MgO·Al_2O_3$ (spinel), $2Al_2O_3·2MgO·5SiO_2$ (cordierite), $CaO·Al_2O_3·2SiO_2$ (anorthite), $2CaO·Al_2O_3·SiO_2$ (gehlenite), Pb, $Pb_2FeNbO_6$, $Pb_2FeTaO_6$, $Pb_2YbNbO_6$, $Pb_2YbTO_6$, $Pb_2LuNbO_6$, $Pb_2LuTaO$, $Pb_3NiNb_2O_9$, $Pb_3NiTa_2O_9$, $Pb_3ZnNb_2O_9$, $Pb_3Fe_2WO_9$, $Pb_2CdWO_6$, $PbTiO_3$, $PbZrO_3$, $PbSnO_3$, $PbHfO_3$, and/or PbO), in combination(s) or individually.

Inventive structures may exclude, contain only detectable traces of (i.e., residual contaminant), or may comprise no more than 5, 4, 3, 2.5, 2, 1, 0.5, 0.1, 0.05, 0.01, or 0.001 wt. %, relative to the total structure weight or the total deposition layer weight, of $RuO_2$, $ReO_2$, $IrO_2$, $SrVO_3$, $CaVO_3$, $LaTiO_3$, $SrMoO_3$, $CaMoO_3$, $SrCrO_3$, $CaCrO_3$, $LaVO_3$, $GdVO_3$, $SrMnO_3$, $CaMnO_3$, $NiCrO_3$, $BiCrO_3$, $LaCrO_3$, $LnCrO_3$, $SrRuO_3$, $CaRuO_3$, $SrFeO_3$, $BaRuO_3$, $LaMnO_3$, $LnMnO_3$, $LaFeO_3$, $LnFeO_3$, $LaCoO_3$, $LaRhO_3$, $LaNiO_3$, $PbRuO_3$, $Bi_2Ru_2O_7$, $LaTaO_3$, $BiRuO_3$, and/or $LaB_6$, in combination(s) or individually.

Inventive structures may exclude, contain only detectable traces of (i.e., residual contaminant), or may comprise no more than 5, 4, 3, 2.5, 2, 1, 0.5, 0.1, 0.05, 0.01, or 0.001 wt. %, relative to the total structure weight or the total deposition layer weight, of B, Ge, Bi, Cr, Pd, In, Ru, Ni, Mo, Co, W, Ir, Al, Au, Cu, and/or Au, in combination(s) or individually.

Inventive structures may exclude, contain only detectable traces of (i.e., residual contaminant), or may comprise no more than 2.5, 2, 1, 0.5, 0.1, 0.05, 0.01, 0.001, 0.0001, 0.00001, or 0.000001 wt. %, relative to the total structure weight or the total deposition layer weight, of $WO_3$ nanorods or $WO_3$ in any form.

Inventive structures may exclude, contain only detectable traces of (i.e., residual contaminant), or may comprise no more than 2.5, 2, 1, 0.5, 0.1, 0.05, 0.01, 0.001, 0.0001, 0.00001, or 0.000001 wt. %, relative to the total deposition layer weight, of crystalline β-$Bi_2O_3$ or $Bi_2O_3$ in any form. Particularly, the platinum layer is generally substantially free of Bi, and inventive structures generally contain no $Bi_2O_3$ layer.

Aspects of the invention provide Pt dithiocarbamate precursors with various alkyl moieties, which are suitable for AACVD depositions, e.g., to produce platinum films useful, for example, as counter electrodes in dye-sensitized solar cells (DSSCs). Inventive precursors may be used as single or plural sources of Pt-metal, and can exhibit high growth rates, e.g., 450, 475, 500, 525, 550, 575, 585, 590, 595, 600, 605, 610, 615, 625, 650, 675, 700 or more nm in 30 minutes, and yield highly pure metal films, e.g., at least 75, 80, 85, 90, 91, 92, 92.5, 93, 94, 95, 96, 97, 97.5, 98, 99, 99.1, 99.5, 99.9, 99.95, 99.99, 99.995, or 99.999 wt. % of a total weight of the deposition layer being the target metal, such as Pt.

Growth rates and/or structures of inventive depositions may be different with precursors containing aromatic substituents following a Volmer-Weber model to form mirror like, well-connected, and highly conductive films, e.g., 175, 180, 185, 190, 195, 197.5, 200, 202.5, 205, 207.7, 210, 215, 220, 225 or more nm of thickness in 20 minutes. Increased deposition times for aromatic-containing precursors can lead to island growth patterns, making some hairline cracks appear and often decreasing the conductivity and catalytic performance.

Comparing performance parameters including current density, open circuit potential, fill factor, and the efficiency to cells with commercial Pt-paste electrodes made by a doctor's blade method, the performance of inventive AACVD-based films were found to be comparable or better. This is performance level is surprising in view of the speed, flexibility, simplicity, and controllable film growth as a function of time using AACVD. Further applications of such inventive films may include electrochemical sensors and energy harvesting.

EXAMPLES

MATERIALS AND METHODS: Platinum (II) chloride ($PtCl_2$) and sodium dibenzyldithiocarbamate ($NaS_2CNBn_2$) shown below in structure (I):

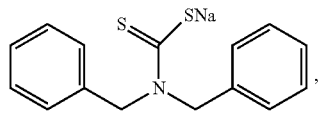

(I)

were purchased from Sigma Aldrich and were used as received. Sodium diisobutyldithiocarbamate ($NaS_2CN$-i-$Bu_2$), having structure (II) below:

(II)

was prepared according to the typical procedure reported in *Inorg. Chem.* 1994, 33, 2743-2747, which is incorporated by reference herein in its entirety. For DSSC fabrications, RUTHNIZER® ruthenium-based dye (N719 ID: Ruthenizer 535-bis TBA), having structure (III) below:

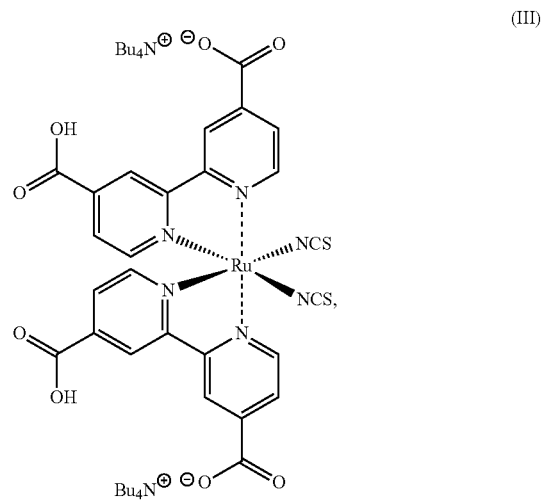

(III)

fluorine-doped tin oxide (2.2 mm, 7Ω/Seq FTO ID: TCO22-7/LI), iodine-based electrolyte ($I^-/I_3^-$ ID: Iodolyte Z-50), titanium paste ($TiO_2$ ID: Ti-Nanoxide T/SP), and platinum paste (Pt ID: Platisol T) were purchased from Solaronix, Switzerland.

INSTRUMENTATION: Elemental analysis was conducted with a Series 11 (CHNS/O), Analyzer 2400 on the complexes. A PerkinElmer Fourier-Transform Infrared (FT-IR) 180 spectrophotometer or NICOLET 6700 FT-IR spectrophotometer was used to record solid state FT-IR spectra of free ligands and their corresponding platinum complexes over the range 4000 to 400 $cm^{-1}$. A JEOL JNM-LA 500 NMR spectrometer was used to perform the $^1$H-NMR and $^{13}$C-NMR spectroscopy in DMSO at an operating frequencies of 500.00 MHz and 125.65 MHz. NMR chemical shifts were measured relative to tetramethylsilane (TMS). The current-voltage (i-V) characteristics for the prepared DSSCs were measured using Keithley 2400 source meter and 1.5 G (100 mW/$cm^2$) IV-5 solar simulator (Sr. #83, PV measurements Incorporation).

SYNTHETIC PROTOCOL: A general procedure for the synthesis of exemplary [Pt(dithiocarbamate)$_2$] complex (1) or (2) involves reacting sodium diisobutyldithiocarbamate (500 mg, 2.20 mmol) for exemplary complex (1) or sodium dibenzyldithiocarbamate (2.20 mmol) for exemplary complex (2) with platinum (II) chloride (300 mg, 1.10 mmole) in acetone as solvent (30 mL) in a two neck flask. The resultant egg-yolk-like solution was stirred for 20 minutes, then 30 mL of pyridine were added, which resulted in a transparent yellow solution. The transparent yellow solution stirred for 30 minutes further. The solution was filtered and kept at room temperature for crystallization. Yellow crystals were obtained on slow evaporation of the solvent.

Exemplary complex (1) [Pt($S_2CN^iBu_2$)$_2$]: m.p. 230 to 235° C. Elemental analysis: $C_{18}H_{36}N_2S_4Pt$, calc'd: C, 35.80%; H, 6.01%; N, 4.64%; S, 21.24%; found: C, 35.21%; H, 6.05%; N, 4.55%; S, 21.35%. FTIR (v/$cm^{-1}$): 3853 w, 3742 w, 3438 br, 2957 s, 2865 w, 2356 s, 1641 w, 1510 s, 1430 m, 1354 m, 1249 s, 1150 s, 1091 m, 969 w, 921 w, 869 w, 808 w, 691 w, 614 s. $^1$H-NMR $\delta_H$(500 MHz, DMSO): 3.27 to 3.39 (8H, m, 4(C$\underline{H}_2$CH(CH$_3$)$_2$), 2.2 to 2.5 (4H, m, 4(CH$_2$C$\underline{H}$(CH$_3$)$_2$); and 0.87 to 0.92 (24H, m, 4(CH$_2$CH(C$\underline{H}_3$)$_2$).

Exemplary complex (2) [Pt(S$_2$CNBn$_2$)$_2$]·pyr: m.p. 250 to 265° C. (decomposition). Elemental analysis: C$_{35}$H$_{33}$N$_3$S$_4$Pt, calc'd: C, 51.33%; H, 4.06%; N 5.13%; S, 15.66%; found: C, 50.78%; H, 4.04%; N 4.99%; S, 15.77%. IR ($v_{max}$/cm$^{-1}$): 3742 w, 3433 br, 3022 w, 2359 w, 2921 w, 1591 w, 1503 s, 1438 s, 1350 m, 1223 s, 1143 m, 1070 w, 1029 w, 981 m, 923w, 881 w, 812 w, 741 s, 694 s, 627 w, 556 w, 514 m. $^1$H-NMR $\delta_H$ (500 MHz, DMSO): 7.63 to 9.29 ppm (5H, m, (NC$_5\underline{H}_5$)), 7.27 to 7.38 (20H, m, 4(C$_6\underline{H}_5$)) and 4.72 (8H, s, 4(C$\underline{H}_2$)).

X-RAY CRYSTALLOGRAPHY: A Stoe Mark II-Image Plate Diffraction System as described in *Monatsh. Chem.* 2017, 148, 669-674, which is incorporated by reference herein in its entirety, equipped with a two-circle goniometer was used to collect the intensity data for complexes (1) and (2) at 173K (−100° C.) using MoK$_a$ graphite monochromated radiation (X=0.71073 Å). Direct methods with SHELXS-97 were used to resolve and confirm the structures. Structural refinement and all further calculations were carried out using SHELXL-2014. The C-bound H-atoms were treated as riding atoms and included in calculated positions: C—H=0.97 to 0.99 Å with U$_{iso}$(H=1.5U$_{eq}$(C) for methyl H atoms and =1.2U$_{e,q}$(C) for other H atoms. The non-H atoms were refined anisotropically, using weighted full-matrix least-squares on F2. A MULABS routine in PLATON was used for semi-empirical absorption correction. Table 1, below, summarizes the crystallography data and refining details for complexes (1) and (2).

TABLE 1

Crystal data and refining details for complex (1) and (2).

| Parameter | Complex 1 | Complex 2 |
|---|---|---|
| Formula | C$_{18}$H$_{36}$N$_2$PtS$_4$ | C$_{30}$H$_{28}$N$_2$PtS$_4$·C$_5$H$_5$N |
| Formula weight (g/mol) | 603.82 | 818.97 |
| Crystal system | Monoclinic | Monoclinic |
| Space group | P2$_1$/c | C2/c |
| a, b, c (Å) | 11.8928(5), 13.0577(5), 16.4868(7) | 20.8211(14), 6.4105(2), 25.3665(17) |
| β(°) | 98.84(3) | 98.766(5) |
| V/Å$^3$ | 2529.84(18) | 3346.2(3) |
| Z | 4 | 4 |
| μ (mm$^{-1}$) | 5.88 | 4.47 |
| Crystal size/mm | 0.40 × 0.40 × 0.40 | 0.45 × 0.17 × 0.13 |
| Temperature (K) | 203 | 203 |
| Wavelength (Å) | 0.71073 | 0.71073 |
| θ value (°) | θ$_{max}$ = 25.6, θ$_{min}$ = 1.7 | θ$_{max}$ = 25.7, θ$_{min}$ = 2.2 |
| T$_{min}$, T$_{max}$ | 0.631, 1.000 | 0.722, 1.000 |
| No. measured, independent and observed [I > 2σ(I)] reflections | 36252, 5087, 4352 | 23293, 3367, 2538 |
| R$_{int}$ | 0.059 | 0.050 |
| R[F$^2$ > 2σ(F$^2$)], wR(F$^2$), S | 0.022, 0.046, 0.95 | 0.017, 0.032, 0.87 |
| Largest diff. peak, hole/e Å$^{-3}$ | 0.79, −0.86 | 0.69, −0.59 |

THIN FILM FABRICATION BY AACVD: Both exemplary complexes, Pt(S$_2$CN-i-Bu$_2$)$_2$] (1) and [Pt(S$_2$CNBn$_2$)$_2$]·py (2), were employed as precursors in AACVD using known AACVD design and infrastructure, e.g., *Adv. Eng. Mater.* 2016, 18, 1200-1207, *J. Electrochem. Soc.* 2018, 165, B302-B309, *ECSI Solid State Sci. Tech.* 2018, 7, P711-P718, and, *Adv. Eng. Mater.* 2015, 18, 1059-1065, each of which is incorporated by reference herein in its entirety. For thin film deposition experiments, 100 mg of each precursor was dissolved in 10 mL of pyridine and used in AACVD.

Prior to the deposition, the glass substrates, e.g., FTO glass, with dimensions of 1.0×2.0 cm$^2$ (W×L) were washed with soapy water, acetone, and isopropanol, then left to air dry. For each deposition experiment, the substrate was loaded horizontally inside a reactor tube, heated up to the deposition temperature of 500° C., maintained there for 10 minutes to equilibrate the temperature, then the deposition process was started. Aerosol mist from each precursor solution was generated using piezoelectric ultrasonic humidifier and the aerosol was carried to the reactor tube by a stream of N$_2$ gas at a rate of 120 cm$^3$/min. The deposition was continued for 30 minutes. The waste exhaust of post-reaction precursor mist was vented into a fume hood. After deposition, the films cooled to room temperature under continuous flow of N$_2$ gas. The resulting coating were uniform, metallic in color, and reflective like a mirror. The adhesion properties of the platinum thin film was verified by the "Scotch tape test" and layers were found strongly intact with the glass (FTO) substrate. Multiple deposition experiments were performed for each sample film to determine the reproducibility of the process, and the data presented is typical for each sample thin film synthesized.

THIN FILM CHARACTERIZATION: A Rigaku Mini-Flex x-ray diffractometer (Japan) with Cu K$_{α1}$ radiation (y=0.15416 nm) was used to record XRD patterns of platinum thin film electrodes at a tube current of 10 mA, and an accelerating voltage of 30 kV. A field emission scanning electron microscope (FE-SEM, Lyra3, Tescan, Czech Republic) was used to record and analyze topographical and cross-sectional images of the film electrodes at an accelerating voltage of 20 kV. The elemental stoichiometry and composition of film electrodes were investigated by energy dispersive x-ray spectroscopy (EDX, INCA Energy 200, Oxford Inst.). A Thermo Scientific Escalab 250Xi spectrometer equipped with a monochromatic Al Kα (1486.6 eV) x-ray source, having a resolution of 0.5 eV was used to perform x-ray photoelectron spectroscopy (XPS) experiments. During the XPS characterization, the ambient conditions of temperature were maintained while the pressure is controlled at 5×10$^{-10}$ mbar. The XPS spectra were referenced with adventitious C is peak at 284.5 eV.

FABRICATION OF DSSC: The doctor blade method was used to coat a titanium dioxide (TiO$_2$) paste onto a specifically marked area of a cleaned FTO glass substrate. Further, the TiO$_2$ coated substrates were calcined at 200° C. for 10 minutes and 455° C. for 25 minutes. Finally, the TiO$_2$-coated FTO conductive glasses were soaked in dye solution (N719 0.5 mM in ethanol) for 24 hours. Afterwards the soaking, the samples (photoanodes) were extracted from the dye solution and rinsed with ethanol to remove unattached/unbonded dye. The electrodes prepared by AACVD platinum deposition from precursor (1) and (2), generated as function of time, i.e., different deposition times, were used as the counter electrodes in different measurements. Both the photoanode and the counter electrode were joined together with SUPER GLUE® adhesive (The Super Glue Corporation) and the iodide based electrolyte (I$^-$/I$_3^-$) was poured between the two joined substrates. The active area of the fabricated DSSCs was calculated to be around 0.25 cm$^2$, e.g., from 0.10 to 0.40, 0.125 to 0.375, 0.15 to 0.35, 0.175 to 0.325, 0.20 to 0.30, 0.225 to 0275, or 0.4 to 0.26 cm$^2$. Comparative cells were prepared except having different platinum counter electrodes using commonly employed doctor's blade method with commercial Pt-paste.

PT-DITHIOCARBAMATES AS SINGLE SOURCE PRECURSORS: Selection of a precursor for any metal deposition can be an important criteria in order to control the thin film properties and performance of the resulting films. Precursors containing heterocyclic, aliphatic, or aromatic substituents can generate different material properties. However, precursors comprising Pt metal frequently produce films composed of pure metal because of the inertness of Pt. To demonstrate this idea, two different mononuclear platinum dialkylthiocarbamates, one with aliphatic substituents, $Pt(S_2CN\text{-}i\text{-}Bu_2)_2$ (1), and other with aromatic substituents, $[Pt(S_2CNBn_2)_2]\cdot pyr$ (2), were prepared, by treating platinum (II) chloride with sodium salts of dithiocarbamates in a stoichiometric ratio of 1:2 in acetone-pyridine solution as shown by Equation (1).

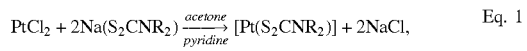

$$PtCl_2 + 2Na(S_2CNR_2) \xrightarrow[pyridine]{acetone} [Pt(S_2CNR_2)] + 2NaCl, \qquad \text{Eq. 1}$$

wherein R is isobutyl (i-Bu) in complex (1), and R is benzyl (Bn) in complex (2). The resulting complexes (1) and (2) were isolated as dry crystalline solids, which are readily soluble in dichloromethane, chloroform, DMSO, pyridine, and other organic solvents. The stoichiometry of both complexes was formulated on the basis of single crystal XRD analysis and was further verified by $^1$H-NMR, CHN elemental analysis, and FT-IR spectroscopy.

The IR spectra of exemplary complexes (1) and (2) show typical absorptions in the 1650 to 1420 cm$^{-1}$ region, which is associated primarily to the stretching vibration of the C—N group present in the N—CSS$^-$ moiety. The bands in the region of the 1030 to 960 cm$^{-1}$-represent $v(CSS)_{sym}$ and $v(CSS)_{asym}$. The $v$(N—CSS) band defines that the carbon-nitrogen bond order is intermediate between a single bond (i.e., v of 1350 to 1250 cm$^{-1}$) and a double bond (i.e., v of 1690 to 1640 cm$^{-1}$). The $v$(N—CSS) mode of dithiocarbamates is shifted to a higher frequency upon coordination, which is consistent with an increase in the double bond character of the carbon-nitrogen bond thereby supporting the bidentate coordination of the S atoms of dithiocarbamate moieties with the central metal atom. The $v$(N—CSS) value of the exemplary complexes synthesized as described herein is comparable to other known dithiocarbamates. Customary splitting patterns for protons attached to the corresponding R groups were observed in the example complexes (1) and (2) by $^1$H-NMR spectra. The proton NMR spectrum for complex (2) showed multiple peaks centered between δ7.31 and 8.70 ppm due to the pyridine ring protons. Such peaks were absent in the spectrum of complex (1), indicating the absence of pyridine in its molecular structure.

PT-FILM ELECTRODES AS COUNTER ELECTRODES IN DSSC: After characterization of the Pt-films deposited via AACVD using the prepared precursors, both films were employed as counter electrodes in self-fabricated dye-sensitized solar cells (DSSCs). The resulting performance of the solar cells was evaluated in comparison to counter electrodes prepared by using commercially available Pt paste (PLATISOL T platinum paste) using the doctor's blade method.

DSSCs were prepared using a TiO$_2$-coated anode and different kinds of Pt-coated counter electrodes. The fabricated solar cells were tested under simulated solar light 100 mW/cm$^2$. For sustaining devices with high sensitizer loadings, the role of counter electrodes can be significant, as the reduction of triiodide ion takes place at the counter electrode and electrolyte interface, which in turn provides sufficient iodide ions for the regeneration of the dye. Therefore, the electrocatalytic activity as well as the conductivity of the films in counter electrodes had to be improved, so as to obtain low charge transfer resistance and low overpotential for the redox species to be regenerated. To attain such low charge transfer resistance and low overpotential, the morphology of the films and the film microstructure should ideally be free from agglomerations and structural connectivity defects, even at high metal loadings. SEM data described below and seen in FIGS. 5A to 5C and 6A to 6C shows that the films generated from $Pt(S_2CN\text{-}i\text{-}Bu_2)_2$ (1) and $[Pt(S_2CNBn_2)_2]\cdot py$ (2) have similar metal loadings, which is probably a time dependent attribute. However, the nature of the precursor can influence or even dictate the decomposition behavior, leading to different types of connectivity in between the deposited metal nuclei. The performance of the DSSCs is discussed in more detail below.

Referring now to the drawings, wherein like reference numerals designate identical or corresponding parts throughout the several views.

Figure 2:
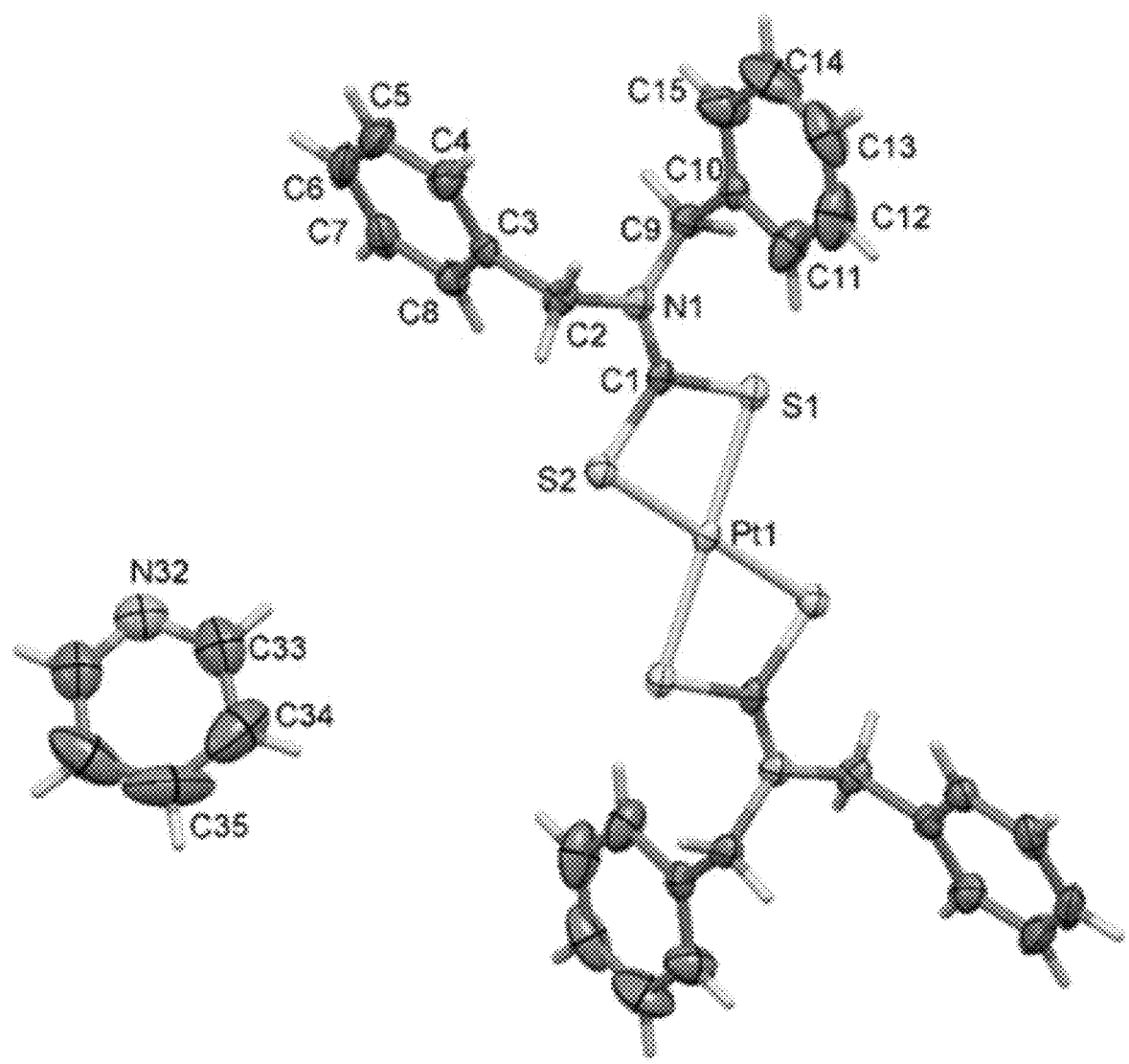
FIG. 2 shows a ball-and-stick molecular structure model of a [Pt(S₂CNBn₂)₂]·py complex (2) with atom labeling, whereby the displacement ellipsoids are drawn at the 50% probability level.

FIGS. 1 and 2 show the x-ray crystallographic structures of the exemplary complexes, $Pt(S_2CN\text{-}i\text{-}Bu_2)_2$ (1) and $[Pt(S_2CNBn_2)_2]\cdot py$ (2), as ball-and-stick models. Table 2, below, indicates the selected bond lengths and bond angles.

TABLE 2

Particular bond lengths (Å) and bond angles (°) of complexes (1) and (2).

| Bond Lengths | (Å) | Bond Angles | (°) |
|---|---|---|---|
| $Pt(S_2CN\text{-}i\text{-}Bu_2)_2$ (1) | | | |
| Pt1-S1 | 2.3290(8) | S1-Pt1-S2 | 75.06(3) |
| Pt1-S2 | 2.3099(9) | S1-Pt1-S3 | 106.22(3) |
| Pt1-S3 | 2.3255(8) | S1-Pt1-S4 | 178.67(3) |
| Pt1-S4 | 2.3172(8) | S2-Pt1-S3 | 178.72(3) |
| C1-S1 | 1.727(3) | S2-Pt1-S4 | 103.68(3) |
| C1-S2 | 1.729(3) | S3-Pt1-S4 | 75.04(3) |
| N1-C1 | 1.317(4) | N1-C1-S1 | 123.93(12) |
| N1-C2 | 1.481(4) | N1-C1-S2 | 128.61(11) |
| $[Pt(S_2CNBn_2)_2]\cdot py$ (2) | | | |
| Pt1-S1 | 2.3283(7) | S1-Pt1-S2 | 74.95(2) |
| Pt1-S2 | 2.3159(6) | S1-Pt1-S2$^i$ | 105.05(2) |
| C1-S1 | 1.723(2) | S2-Pt1-S2$^i$ | 180.0 |
| C1-S2 | 1.720(3) | N1-C1-S1 | 123.93(12) |
| N1-C1 | 1.319(4) | N1-C1-S2 | 128.61(11) |
| N1-C2 | 1.480(3) | | |

Exemplary complex (1) consists of neutral atoms having a platinum ion coordinated by two structurally equivalent diisobutyldithiocarbamate ligands. Exemplary complex (2) also comprises a platinum ion and dibenzyldithiocarbamate ligands, but with a pyridine solvate molecule in the crystal lattice. In both complexes, the platinum atom lies on a center of inversion and adopts a distorted square planar geometry having the cis bond angles of around 75° and 105°. The trans bond angles in exemplary complex (1) are about 178°, while in exemplary complex (2), the trans bond angles are 180°.

The exemplary dithiocarbamates bind as symmetric bidentate ligands. The bidentate binding of two sulfur atoms of the dithiocarbamates to platinum makes the S1-Pt-S2 angle significantly smaller, i.e., ~75°. The average bond length of ~2.32 Å for the Pt-S bonds in the exemplary complexes is identical with the values found in the analogous Pt-dithiocarbamate complexes. However, the average bond length in the exemplary complexes is somewhat longer than that observed in certain Pt$_5$ metallacycles, such as

[PtCl(pyrrolidine-dithiocarbamate)]$_5$. The C—S bond distances in complexes (1) and (2) are almost identical. The shorter bond lengths for N—C(S$_2$) relative to N—C(C) in the exemplary dithiocarbamate complexes correspond to a bond order intermediate between single and double bond. There were no significant interactions present between the molecules in the crystal packing.

Figure 3:
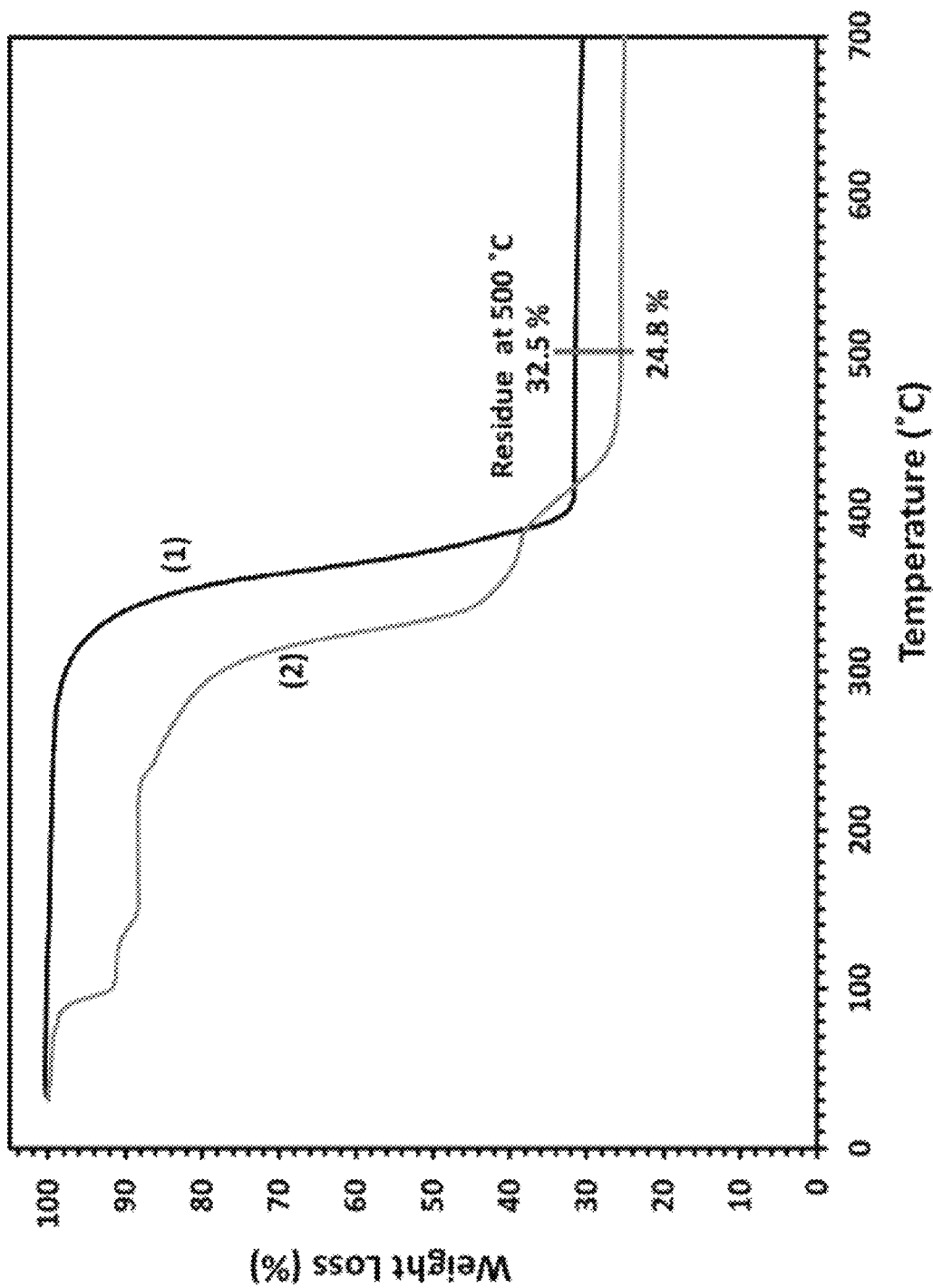
FIG. 3 shows thermogravimetric analysis (TGA) curves of complex (1) and (2) recorded in flowing $N_2$ gas (20 mL/minute) at a heating rate of 10° C./minute.

FIG. 3 shows the pyrolysis characteristics of the exemplary complexes, as examined by thermogravimetic analysis (TGA). FIG. 3 compares the TGA curves of both complexes recorded in the temperature range of 35 to 700° C. under the continuous flow of N$_2$ gas at 20 mL/minute and a heating rate of 10° C./minute. FIG. 3 reveals that the decomposition of complex (1) occurs in a single step while degradation of complex (2) accomplishes in a multistep mechanism, until both complexes (1) and (2) convert into the final products.

Complex (1) remains stable up to 270° C. and the diisobutyl dithiocarbamate moiety is lost in a discrete temperature range of 275 to 450° C., leaving a residue of 32.5% of the initial weight at 500° C. This residual weight (32.5%) matches well with theoretical weight percent of 32.3% calculated for pure platinum metal from complex (1).

Contrary to exemplary complex (1), the thermal degradation of exemplary complex (2) starts early, with a first weight loss step in a temperature range of 70 to 115° C., and is attributed to the loss of solvate molecules (pyridine) present in the crystal lattice of complex (2). The multiple decomposition steps in the temperature range of 115 to 500° C. are regarded as the complete elimination of dibenzyl dithiocarbamate group, producing a sustainable residue mass of 24.8% of the original, fitting well with the theoretical mass (~24.0%) for the pure platinum from complex (2). Further annealing beyond 500° C. did not produce any significant change in the residue weights indicating the end of volatile weight loss features and formation of the stable end product even at 700° C.

Figure 4:
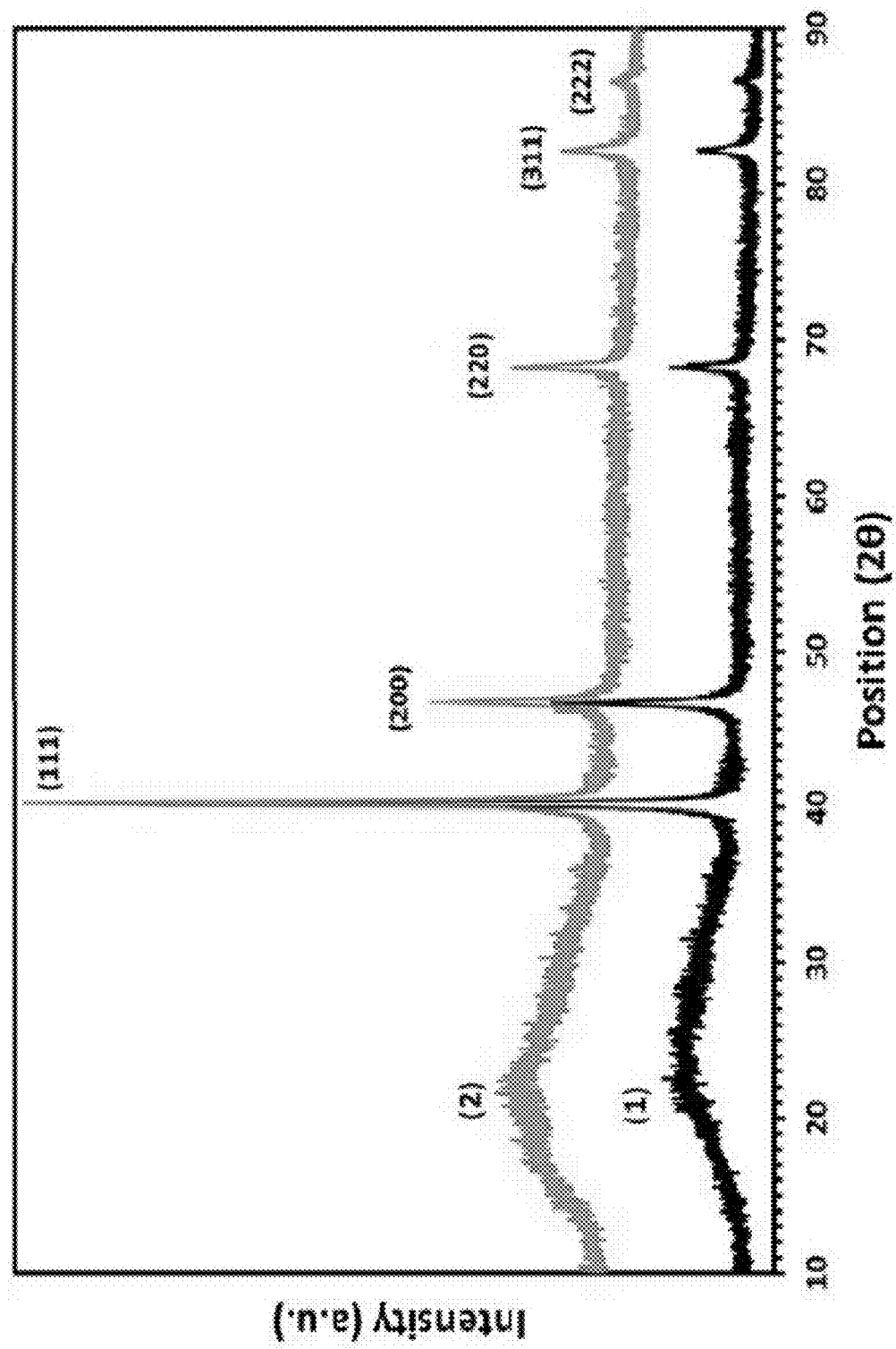
FIG. 4 shows x-ray diffraction (XRD) patterns of cubic-platinum films deposited from precursor [Pt($S_2$CN-i-$Bu_2$)2] (1) and [Pt($S_2$CN$Bn_2$)$_2$]·py (2) on plain glass substrates at 500° C. via AACVD.

FIG. 4 shows powder X-ray diffraction analyses of films obtained by AACVD of the exemplary complexes (1) and (2) in solution form. The thin film growth was first examined on plain glass substrates at 500° C. under a N$_2$ atmosphere. As can be observed in FIG. 4, the XRD patterns of both films look similar in terms of peak position, and indicating the formation of diffractively similar products. The diffraction peaks occurring at 2θ of 40.0°, 46.5°, 68.0°, 81.0°, and 86.4° respectively correspond to the reflection planes (111), (200), (220), (311), and (222). The peak position, peak intensity, and d-spacing values of measured XRD matched well with the standard cubic platinum pattern (01-087-0647) indicating the synthesis of a pure platinum thin films from both precursors.

In both cases, i.e., AACVD using exemplary complexes (1) and (2), the product is highly crystalline and all peaks are well resolved. Any kind of crystalline impurities, such as oxide or sulfide contamination, or other crystalline phases of platinum, cannot be identified from the XRD patterns in FIG. 4. Another feature visible in the XRD analysis is that the growth of crystalline Pt films is strongly in preferred direction of the (111) plane, which has been reported for the growth of similar platinum films. *Adv. Eng. Mater.* 2016, 18(7), 1200-1207, which is incorporated by reference herein in its entirety, describes that AACVD generation of Pt-films on Si/SiOx as well as polycrystalline yttria-stabilized zirconia (YSZ) substrates using Pt(acac)$_2$ can produce patterns of preferred orientations, as do the films grown herein on plane glass substrates. Thus, the growth of Pt may not depend upon the nature or orientation of the substrate, but rather be controlled by the closely packed (111) planes having low surface energy. The effect of precursor also does not necessarily influence the crystalline nature of deposited Pt films. However, precursors may have a role in growth patterns due to differences in decomposition processes in the aerosol. Moreover, the thickness of the film may represent the crystalline size in the preferred orientation.

Figure 5A:
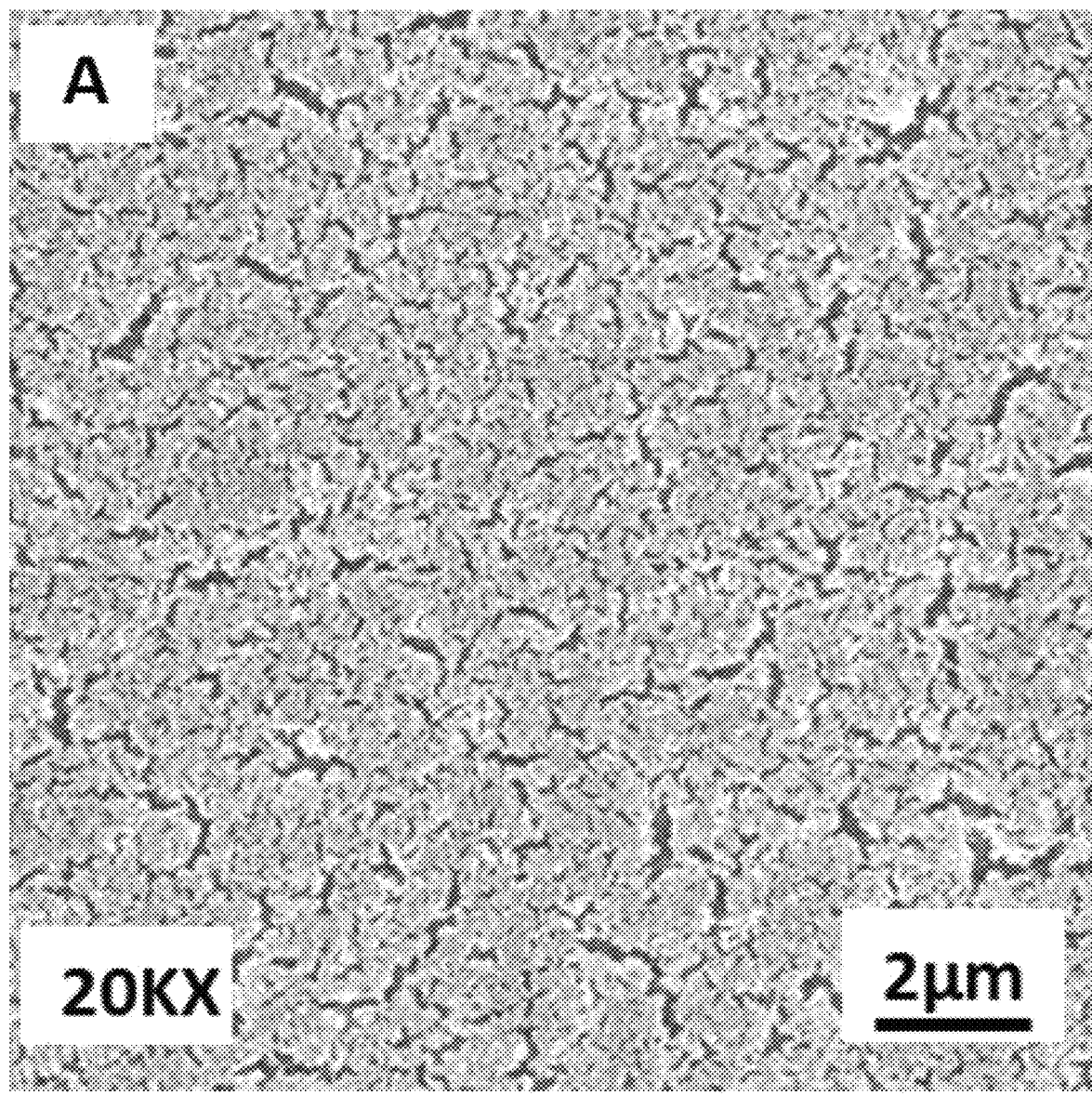
FIG. 5A shows a scanning electron microscope (SEM) images of a top plan view of an exemplary palladium thin film at low resolution, deposited from the Pt($S_2$CN-i-$Bu_2$)$_2$ precursor (1) on an FTO glass substrate.
Figure 5B:
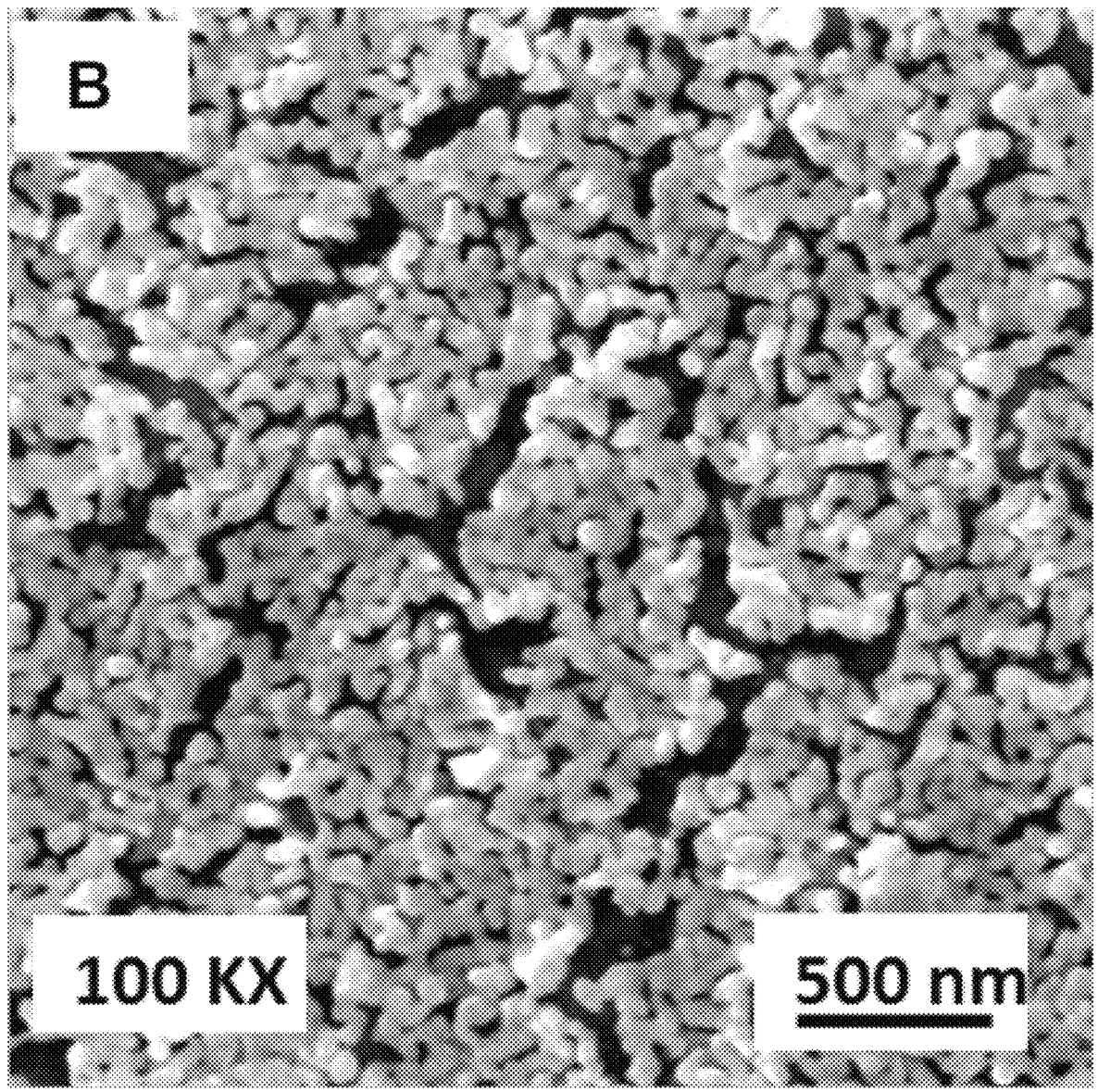
FIG. 5B shows an SEM top plan view of the exemplary palladium thin film from FIG. 5A at higher resolution.
Figure 5C:
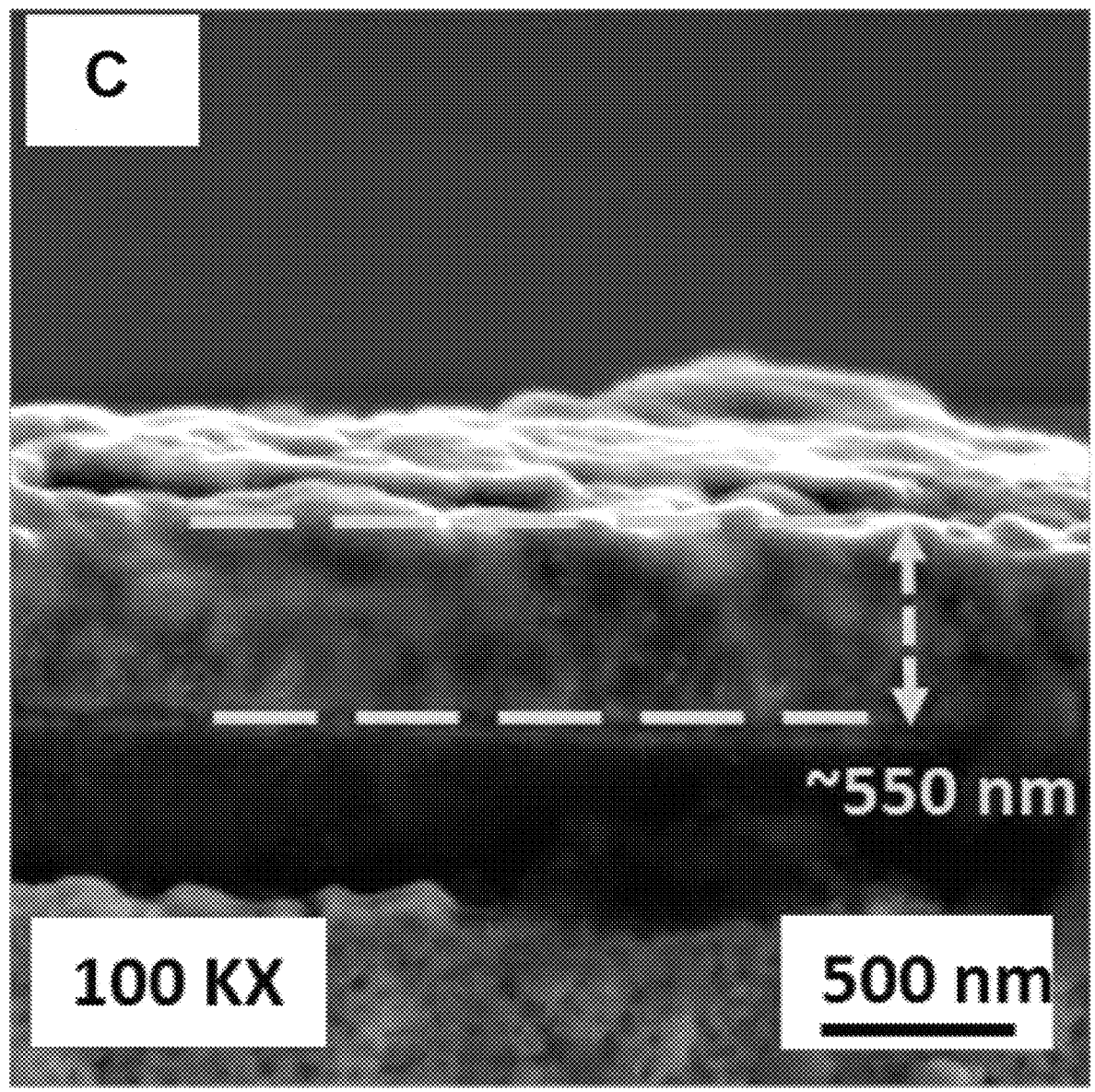
FIG. 5C shows a cross-sectional SEM view of the exemplary palladium thin film from FIGS. 5A and 5B at high resolution.
Figure 6A:
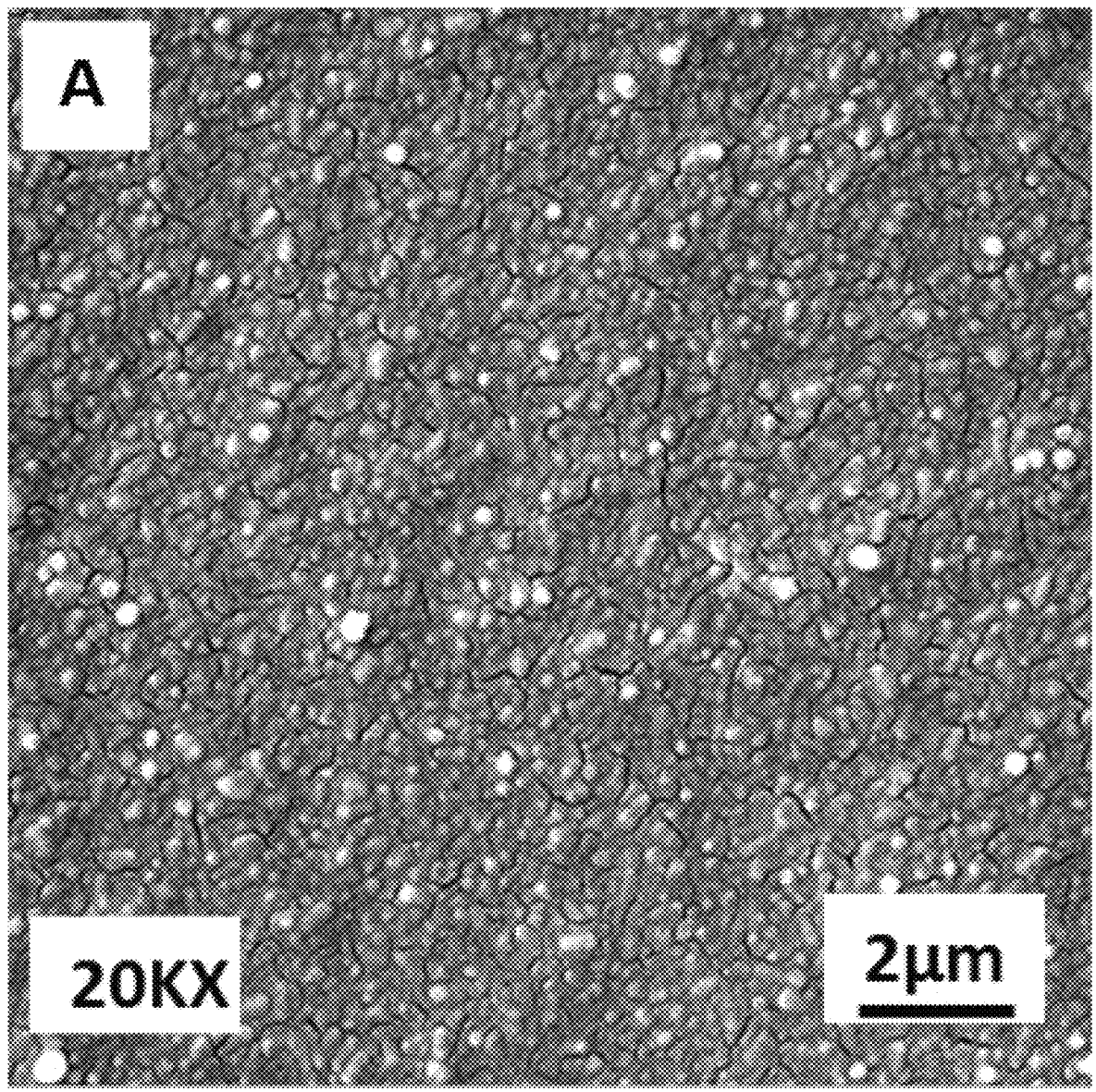
FIG. 6A shows an SEM top plan view at low resolution, deposited from the [Pt($S_2$CN$Bn_2$)$_2$]·py precursor (2) respectively on an FTO glass substrate.

FIG. 5A to 5C and FIG. 6A to 6C show scanning electron microscope (SEM) images of the surface morphologies of platinum thin films deposited on FTO glass substrates using exemplary complexes (1) and (2). The low resolution SEM images, FIGS. 5A and 6A, show the growth of uniform films with complete coverage of substrate surface in a deposition time of 30 minutes. Even the low resolution images in FIGS. 5A and 6A show that the nature of the precursor has affected the film growth pattern in terms of film microstructure. The film deposited from exemplary complex (1), Pt(S$_2$CN-i-Bu$_2$)$_2$, has a surface coverage of 85%, e.g., at least 80, 82.5, 85, 87.5, or 90% and/or up to 99, 97.5, 95, 92.5, or 90% coated under the standard protocol, with portions of the underlying substrate visible. On the other hand, the surface coverage in case of deposition from exemplary complex (2), [Pt(S$_2$CNBn$_2$)$_2$]·py, is more than 98% with only very thin fault lines in the structure. The rate of deposition for precursors described herein is higher than previously reported depositions on silicon-based substrates, and comparable to the YSZ substrates.

Figure 6B:
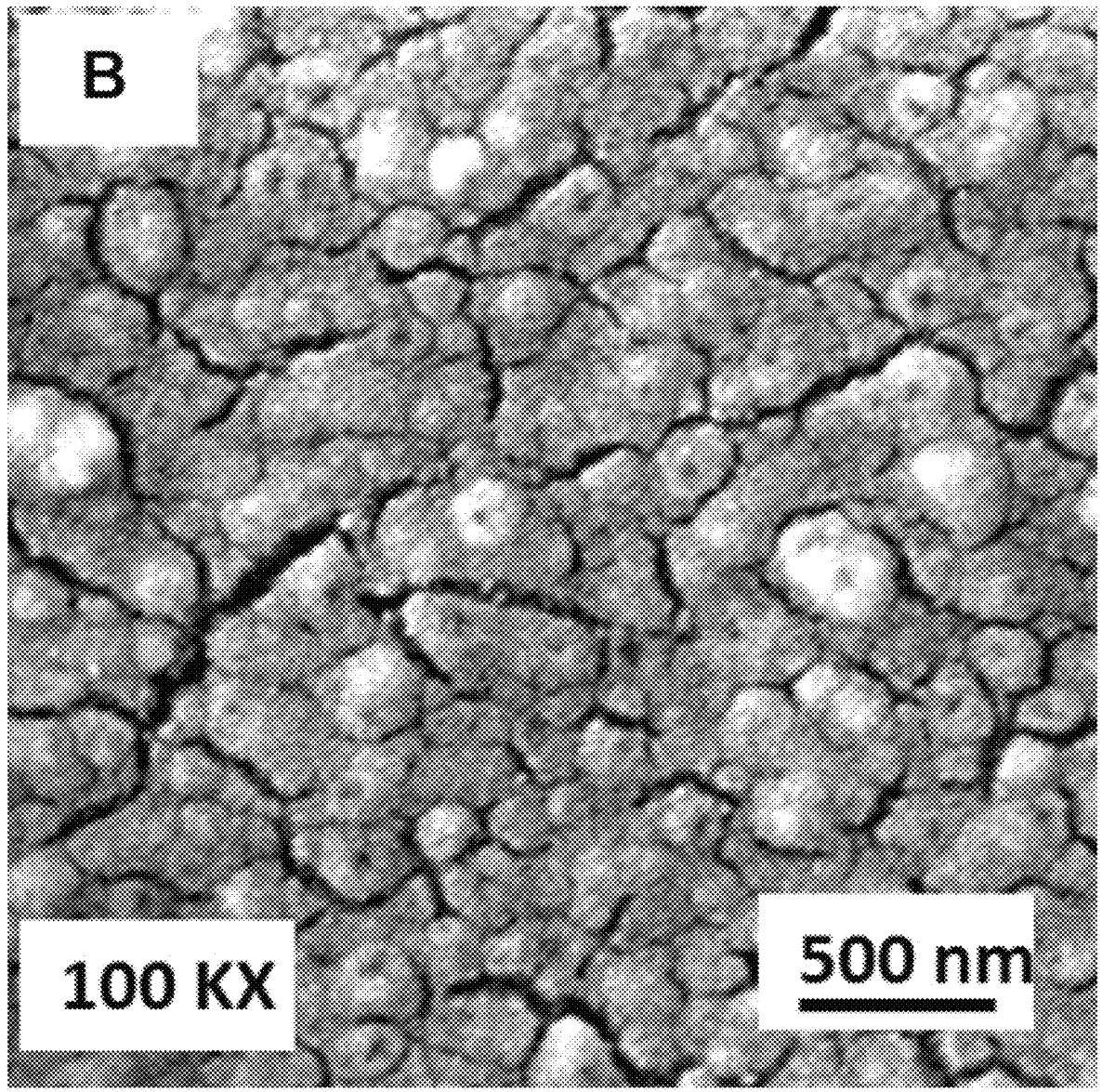
FIG. 6B shows an SEM top plan view of the exemplary palladium thin film from FIG. 6A at higher resolution.

FIGS. 5B and 6B show high resolution top plan images of the same films, more deeply exploring the microstructure of the inventive films to illustrate the film enhancing effects of the inventive precursors. Using exemplary complex (1), Pt(S$_2$CN-i-Bu$_2$)$_2$, as shown in FIG. 5B, the deposited film comprises a network of interconnected nanorods or fused spheroids, leaving intermittent empty spaces in between the interconnected spheroids/nanorods. Using exemplary complex (2), [Pt(S$_2$CNBn$_2$)$_2$]·py, as shown in FIG. 6B, the deposited film developed into a network of island, having a bumpy coral or lichen-like morphology with small fractures in between. Such a film as prepared from exemplary complex (2), [Pt(S$_2$CNBn$_2$)$_2$]·py, can have high percolation leading to lower sheet resistance, moving towards a value that of bulk material, and thus, can be more applicable in various electrode systems. FIGS. 5B and 6B show no clear exclusive agglomeration of the Pt-nuclei to form large particles, rather an at least partially homogenous, dispersed growth of the film which most owe to the AACVD deposition technique. The grain boundaries of the crystallites from exemplary complex (1), Pt(S$_2$CN-i-Bu$_2$)$_2$, are in the size range of 50 to 100 nm and can be clearly marked. While the grain boundaries of platinum film produced from exemplary complex (2), [Pt(S$_2$CNBn$_2$)$_2$]·py, lie in the size range of 10 to 20 nm, e.g., at least 5, 7.5, 9, 10, 11, or 12.5 nm and/or up to 25, 22.5, 21, 20, 19, or 17.5 nm, and diffused into each other.

Figure 6C:
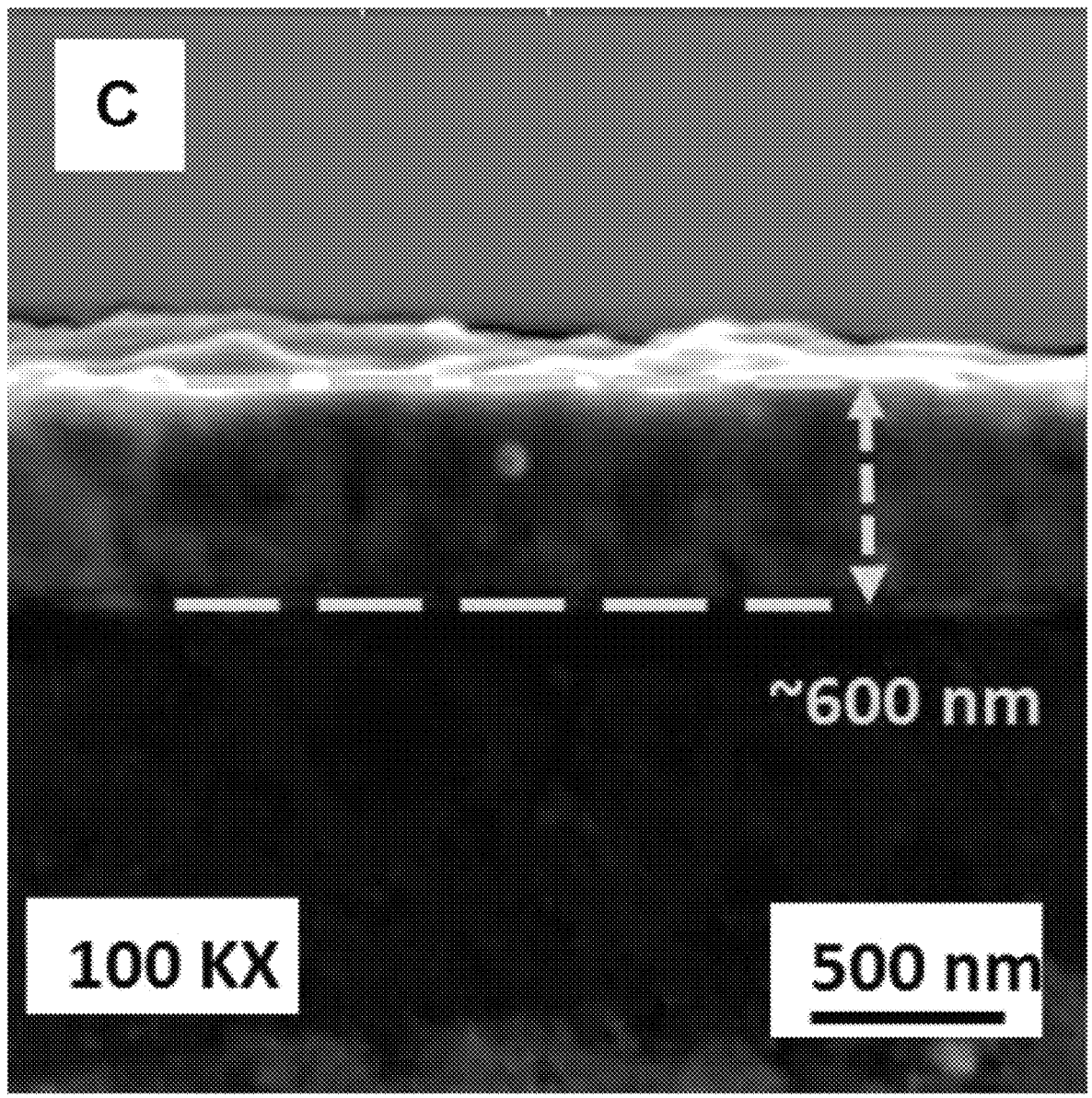
FIG. 6C shows a cross-sectional SEM view of the exemplary palladium thin film from FIGS. 6A and 6B at high resolution.
Figure 7A:
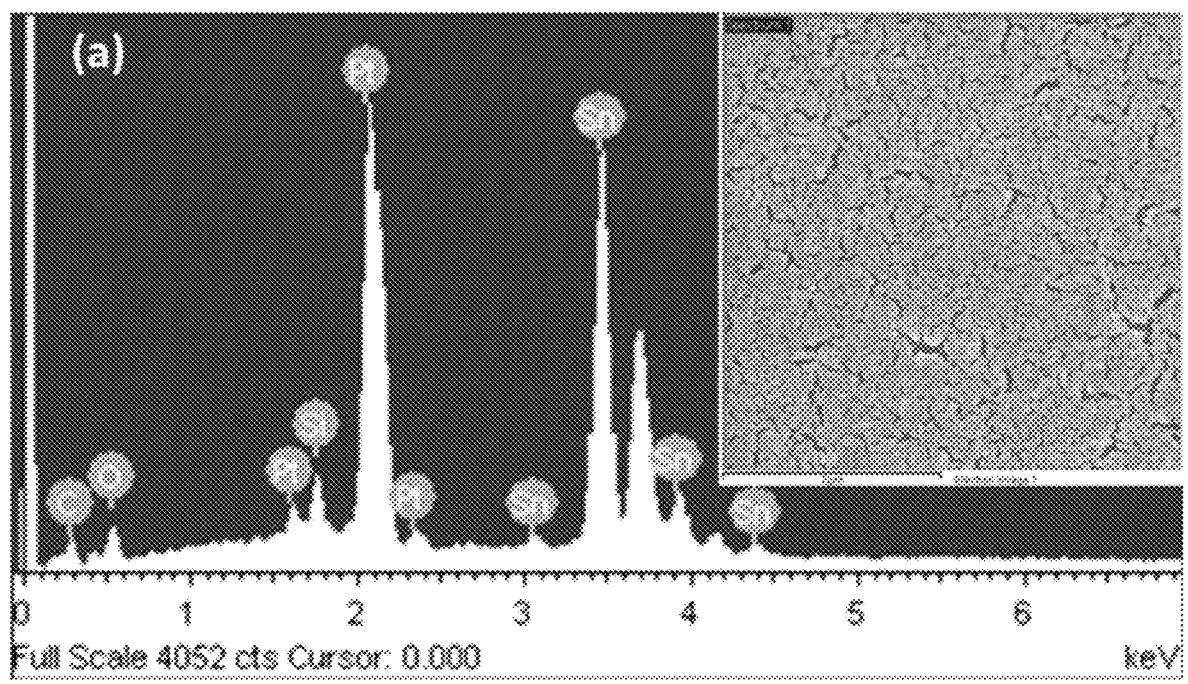
FIG. 7A shows an energy-dispersive x-ray spectroscopy (EDX) spectrum of a platinum thin film deposited from the [Pt($S_2$CN-i-$Bu_2$)$_2$] precursor (1) on an FTO glass substrate.
Figure 7B:
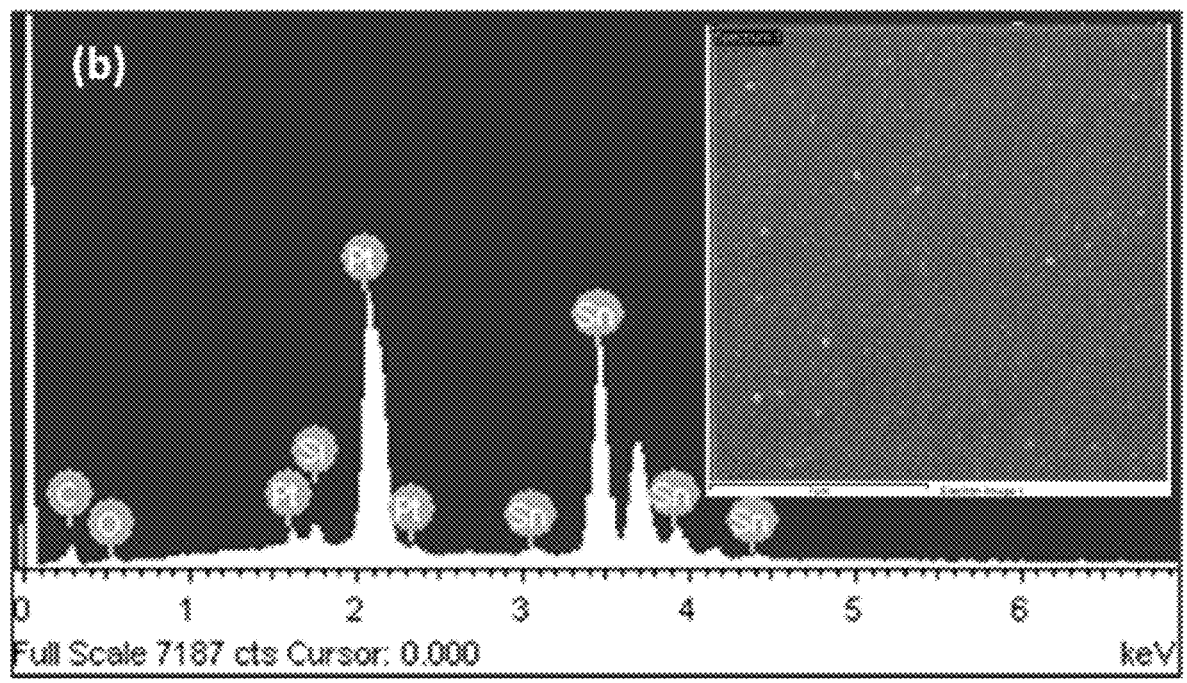
FIG. 7B shows an EDX spectrum of a platinum thin film deposited from the [Pt($S_2$CN$Bn_2$)$_2$]·py precursor (2) on an FTO glass substrate.

FIGS. 5C and 6C show cross sectional views of the platinum films from AACVD deposition of exemplary complex (1), Pt(S$_2$CN-i-Bu$_2$)$_2$ (FIG. 5C), and exemplary complex (2), [Pt(S$_2$CNBn$_2$)$_2$]·py (FIG. 6C). The cross-sectional views in FIGS. 5C and 6C indicate that both of the films are compact in nature and relatively uniform in thickness. The thickness of the layers were estimated to be around 550 and 600 nm, e.g., at least 450, 475, 485, 495, 505, 515, 525, 535, 545, 550, 555, 560, 565, 570, 575, or 580 nm and/or up to 700, 685, 675, 670, 665, 660, 650, 645, 640, 635, 630, 625, 620, 615, 610, 605, 600, 595, 585, 575, or 550 nm. FIGS. 7A and 7B show the elemental stoichiometry of the thin films observed by energy dispersive x-ray analysis (EDX). FIGS. 7A and 7B show by EDX that elemental platinum is present in both of the deposited films. The elements from FTO glass substrate such as Sn, Si, and 0 were also visible, i.e., not excluded, from both of the EDX spectra. Remarkably, no sulfur contamination was indicated in the EDX spectra of either deposition, although sulfur is usually present in films deposited using dithiocarbamate ligand-based precursors. That is inventive films may have sulfur only in amounts below the EDX detection limits and/or of no more than 10, 7.5, 5, 4, 3, 2, 1, 0.5, 0.1, 0.01, 0.001, 0.0001, 0.00001, or 0.000001 wt. % S relative to the total weight of the deposition. Generally, sulfur is a part of the crystal lattice of the deposited films as a metal sulfide. The EDX data in FIGS. 7A and 7B show that the dithiocarbamte moiety can be completely removed upon thermal decomposition of both precursors under AACVD, leaving only Pt in the final deposition product from either inventive precursor, i.e., $Pt(S_2CN\text{-i-}Bu_2)_2$ (1) in FIG. 7A, and $[Pt(S_2CNBn_2)_2]\cdot py$ (2) in FIG. 7B.

FIG. 8 shows purity and chemical composition analysis of the deposited platinum films by x-ray photoelectron spectroscopy (XPS). High resolution XPS spectra of the Pt film surfaces from the inventive precursors, i.e., $Pt(S_2CN\text{-i-}Bu_2)_2$ (1) and $[Pt(S_2CNBn_2)_2]\cdot py$ (2), are overlaid in FIG. 8. A Pt doublet peak can be seen at 71.1 eV ($4f_{7/2}$) and 74.4 eV ($4f_{5/2}$) in each XPS, which agrees with known values for pure Pt metal.

Figure 9:
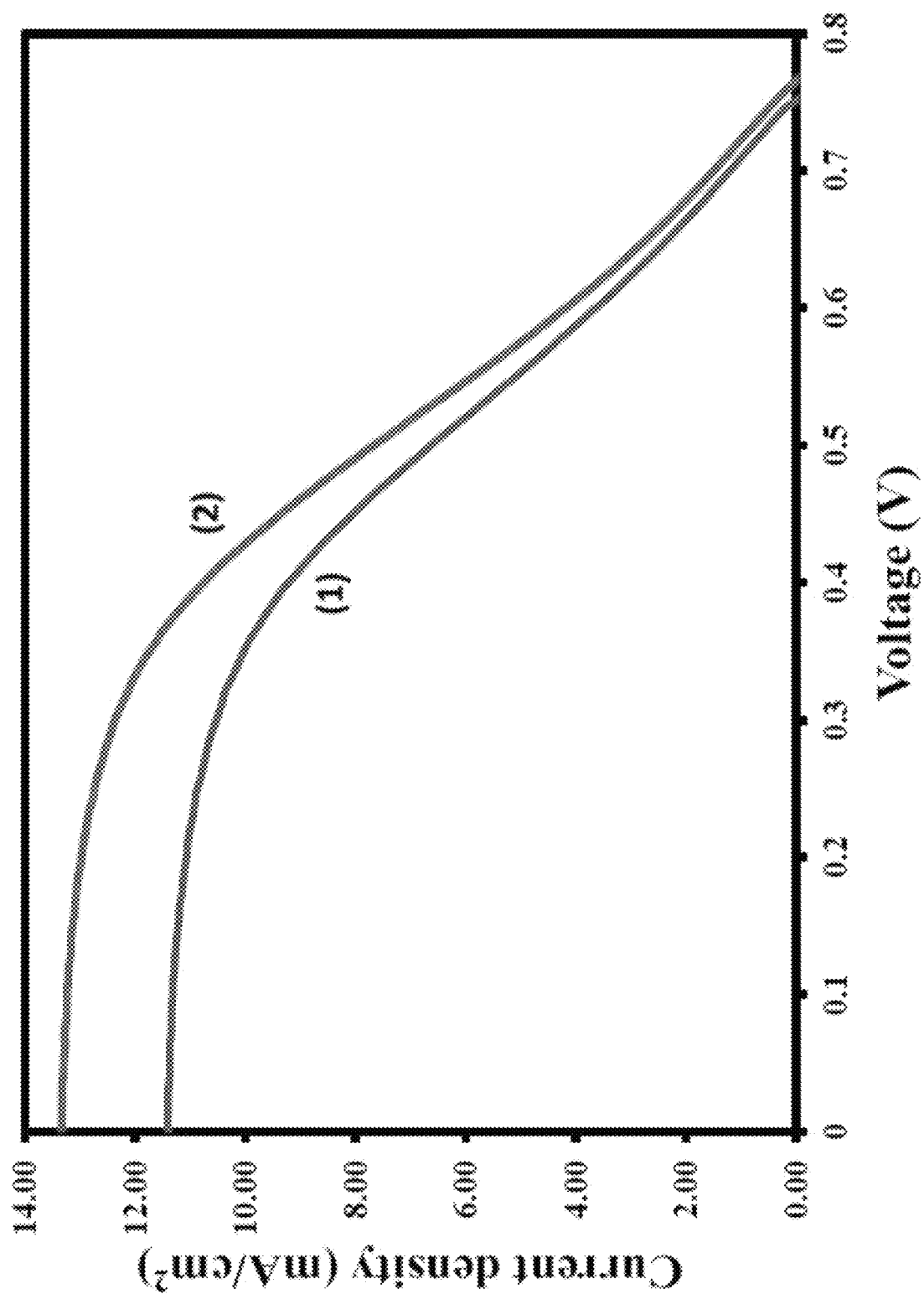
FIG. 9 shows current-voltage characteristics of fabricated dye-sensitized solar cells (DSSC) with films formed from [Pt($S_2$CN-i-$Bu_2$)$_2$] (1) and [Pt($S_2$CN$Bn_2$)$_2$]·py (2) with 30 minutes of deposition time.
Figure 10A:
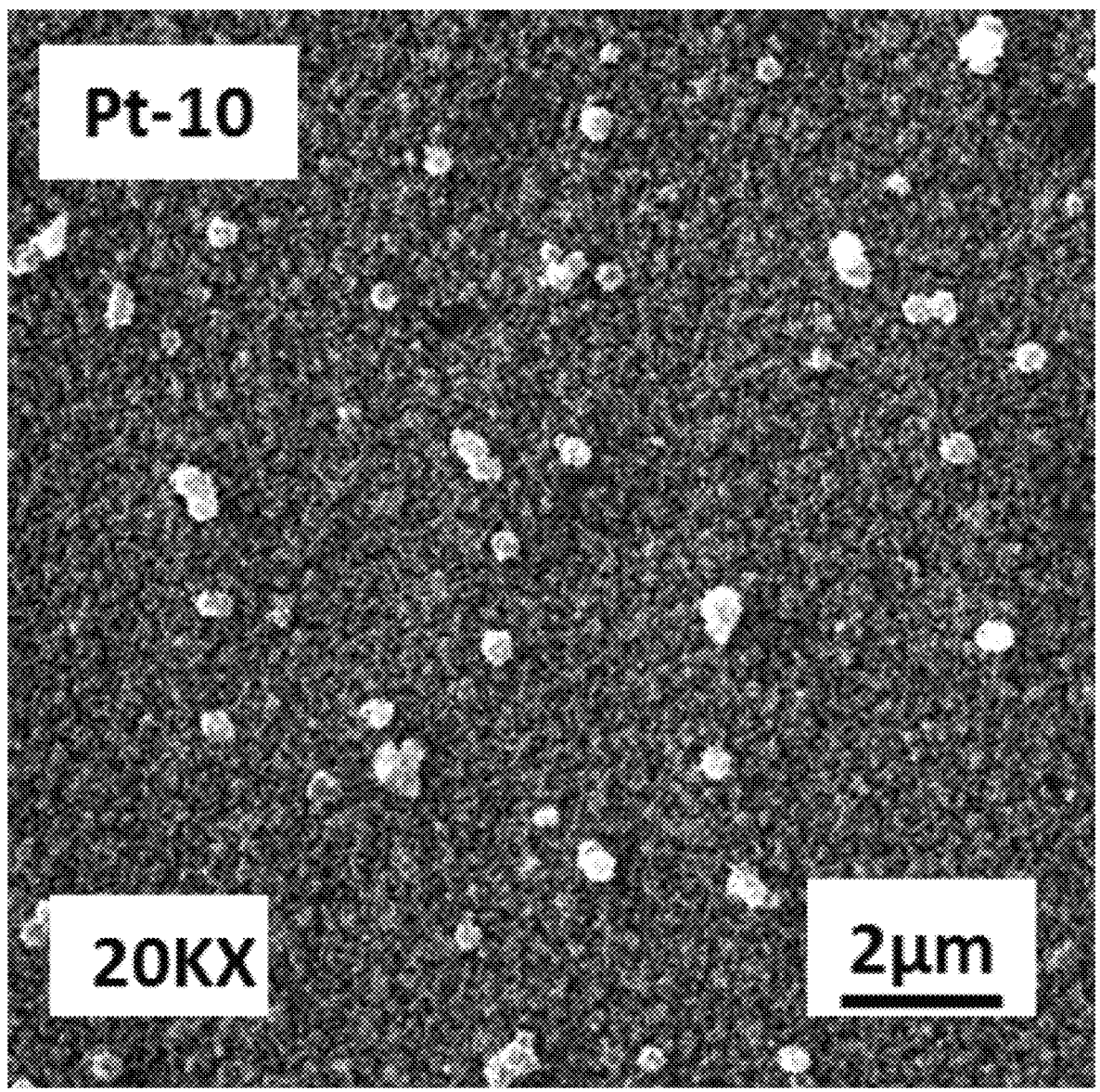
FIGS. 10A to 10C show SEM images of palladium thin films deposited from precursor [Pt($S_2$CN$Bn_2$)$_2$]·py (2) for 10 minutes of deposition time at difference magnifications.
Figure 10B:
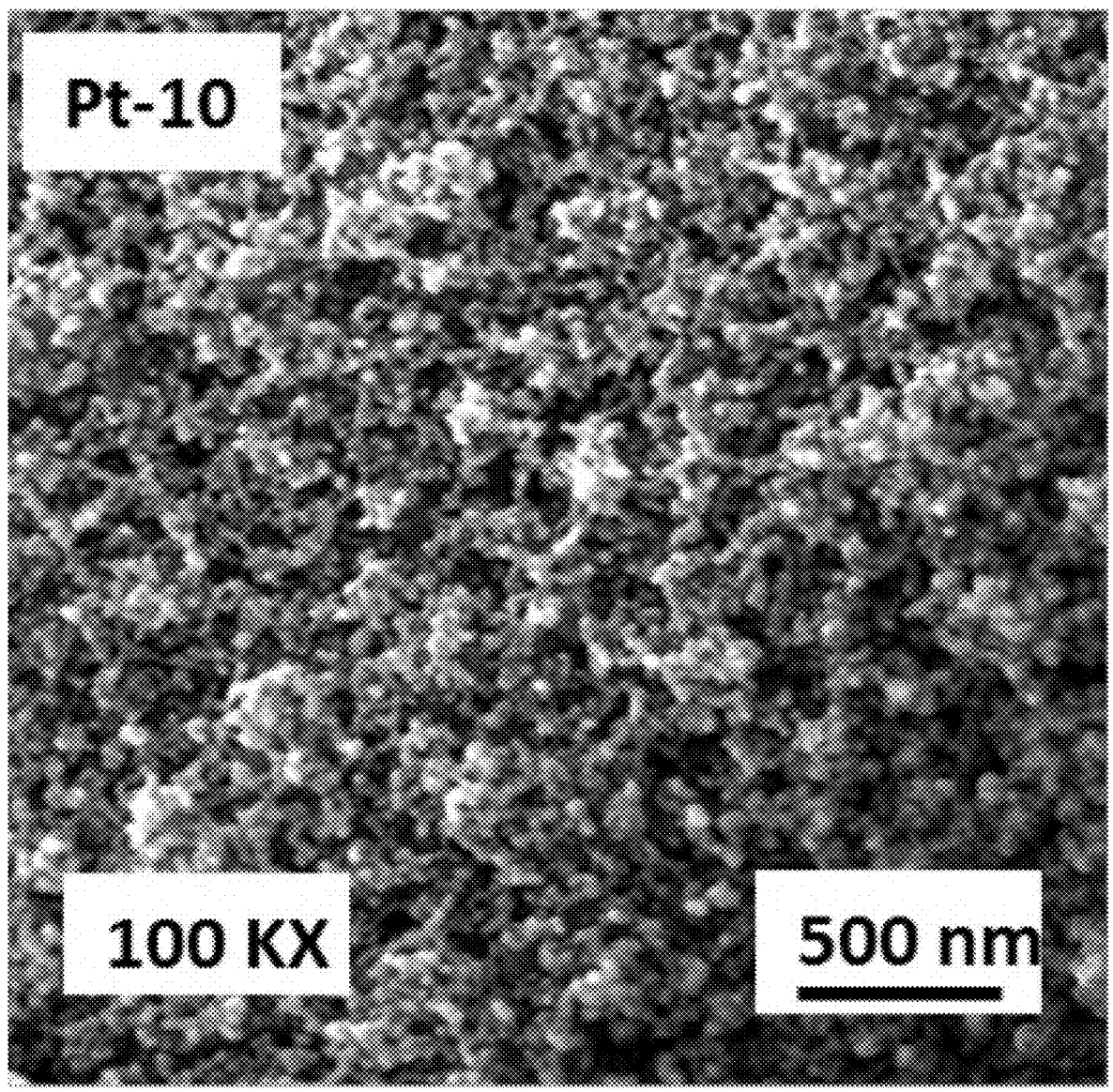
Figure 10C:
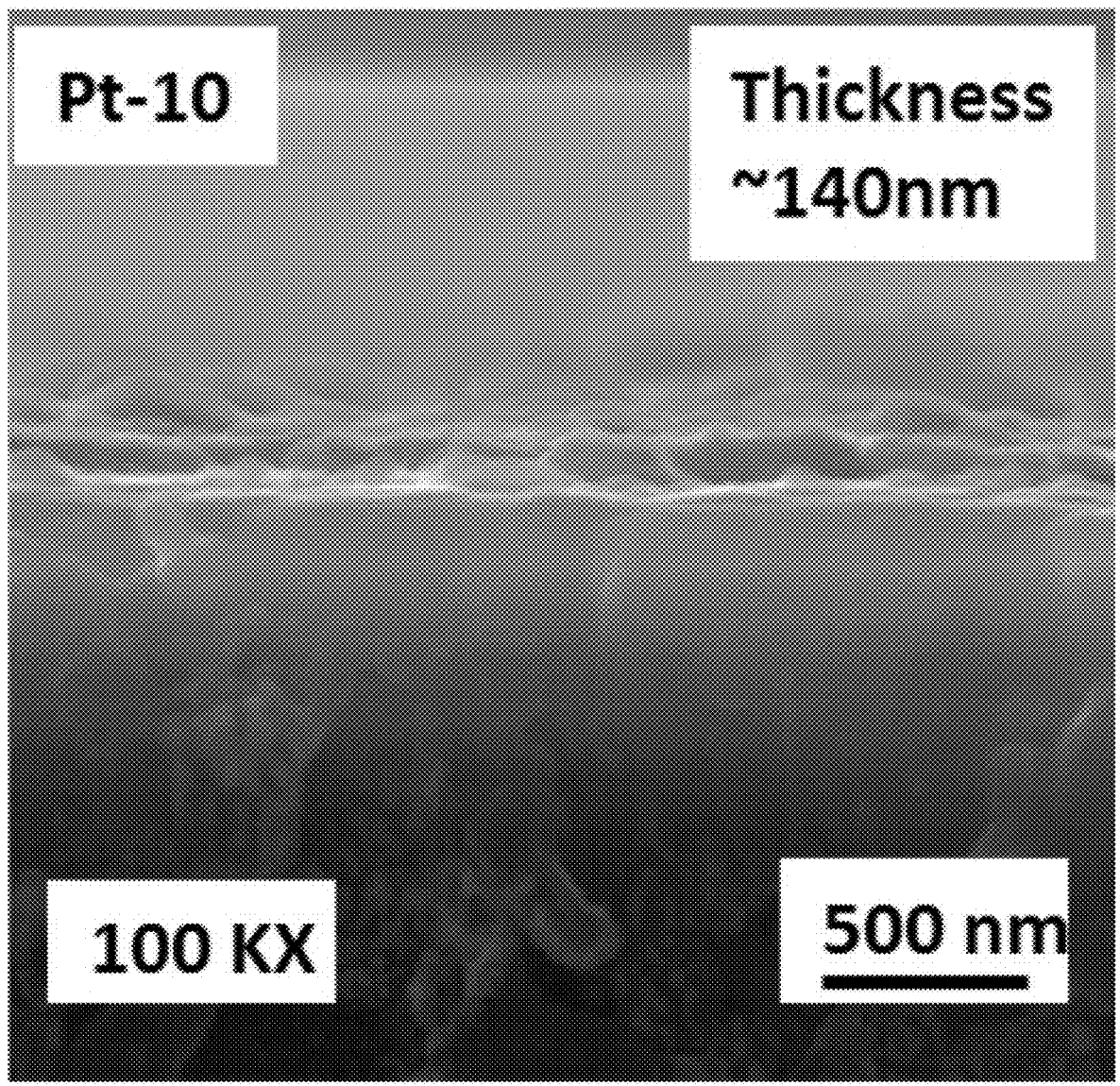

As indicated by SEM (FIGS. 5 and 6) and discussed above, films made from complex (2), $[Pt(S_2CNBn_2)_2]\cdot py$, can have higher connectivity than those made from complex (1) $Pt(S_2CN\text{-i-}Bu_2)_2$. When these films were applied as counter electrodes in DSSC, as seen in FIG. 9, the resulting photovoltaic cell performance was likewise different from each other. The current-voltage characteristics of these films in FIG. 9 indicates that the current density of the film from precursor (2), i.e., $[Pt(S_2CNBn_2)_2]\cdot py$, is superior than that of precursor (1), i.e., $Pt(S_2CN\text{-i-}Bu_2)_2$, as the film from $[Pt(S_2CNBn_2)_2]\cdot py$ has higher coverage as well as higher conductivity. The corresponding photovoltaic parameters along with the data from a commercial configuration of Pt-metal based solar cell are also summarized below in Table 3.

TABLE 3

Photovoltaic properties of fabricated DSSCs for both Pt complexes.

| Cell Structure | $J_{sc}$ (mA/cm$^2$) | $V_{oc}$ (mV) | FF | η (%) | $R_s$ | $R_{sh}$ |
|---|---|---|---|---|---|---|
| TiO$_2$/N719/ Pt complex (1) | 11.40 | 751 | 0.432 | 3.69 | 169 | 4463 |
| TiO$_2$/N719/ Pt complex (2) | 13.34 | 765 | 0.423 | 4.32 | 168 | 3485 |
| TiO$_2$/N719/ Pt commercial | 14.62 | 771 | 0.389 | 4.40 | 153 | 1106 |

As indicated in Table 3, photovoltaic performance can be characterized by certain factors such as short circuit current density, $J_{sc}$ (mW/cm$^2$), open circuit voltage, $V_{oc}$, (mV), fill factor (FF), and the energy conversion efficiency η (%). In addition, the values of series resistance ($R_s$), and shunt resistance ($R_{sh}$) are also relevant. The fill factor was almost unaffected by changing the dithiocarbamate precursor used in making the counter electrode, whereas the open circuit potential was higher in case of precursor (2), i.e., $[Pt(S_2CNBn_2)_2]\cdot py$.

A higher $V_{oc}$ means a decreased possibility of recombination at the photoanode and electrolyte interface. Consequently, given the higher Voc of the film from precursor (2), i.e., $[Pt(S_2CNBn_2)_2]\cdot py$, the short circuit current and the efficiency of the resulting cells is higher for the films made from precursor (2), i.e., $[Pt(S_2CNBn_2)_2]\cdot py$. The performance values from both electrodes were comparable to values obtained from a homemade cell fabricated in a commercial configuration. The efficiencies were calculated from an active electrode area of 0.25 cm$^2$, providing efficiency in the same range as reported previously.

On the other hand, the fill factor (FF) value is dependent upon a number of factors including two important parameters, $It_s$ and $R_{sh}$. As shown in Table 3, lower resistance values of the commercial configuration make the FF value of the commercial configuration lower than AACVD-made electrodes. Thus, the efficiency and the current density of the commercial cell is slightly higher than the cells with a counter electrode from precursor (2), i.e., $[Pt(S_2CNBn_2)_2]\cdot py$. Irrespective, film conductivity can control the catalytic efficiency.

FIG. 10A to 10C and FIG. 11A to 11C show SEM images from a time dependent study of the formation of films from precursor (2), i.e., $[Pt(S_2CNBn_2)_2]\cdot py$. The time-dependent studies were designed to better understand the effect of metal loadings, reflectivity, connectivity, and the resulting conductivity of the films on the performance. For this purpose, films were prepared from precursor (2), i.e., $[Pt(S_2CNBn_2)_2]\cdot py$, at deposition times of 10 minutes (FIG. 10A to 10C) and 20 minutes (FIG. 11A to 11C) for comparison with the 30 minutes depositions shown in FIGS. 5 and 6, and the SEM micrographs of these films are shown in FIGS. 10 and 11.

Comparing the images in FIGS. 10 and 11 with the film microstructure in FIG. 6, all films being made from precursor (2), i.e., $[Pt(S_2CNBn_2)_2]\cdot py$, it appears that a regular growth pattern of the metal films is followed. Particularly, the deposition pattern of the metal films appears to follow the Volmer-Weber growth mode in forming islands, also described in *Sci. Rep.* 2017, 7, 44576, which is incorporated by reference herein in its entirety. The Volmer-Weber growth mode affects the connectivity and the resultant conductivity of the films. This Volmer-Weber growth phenomenon is particularly expressed when the film thickness is in the range of electron mean free path (MFP), even changing the film behavior to an insulator when the thickness reaches the percolation length.

According to the Volmer-Weber growth pattern, films start to form spherical nanosized entities from the original metal nuclei, which then coalesced together to form networks or films. A 10 minute deposition shown as in FIG. 10A to 10C indicates that the film has already attained a thickness of 140 nm and a closely wound network has already been formed. However, the network in FIG. 10A to 10C has nano-spaces in between the coalesced Pt-features and the agglomerated particles over the surface are shown by low resolution image.

Figure 11A:
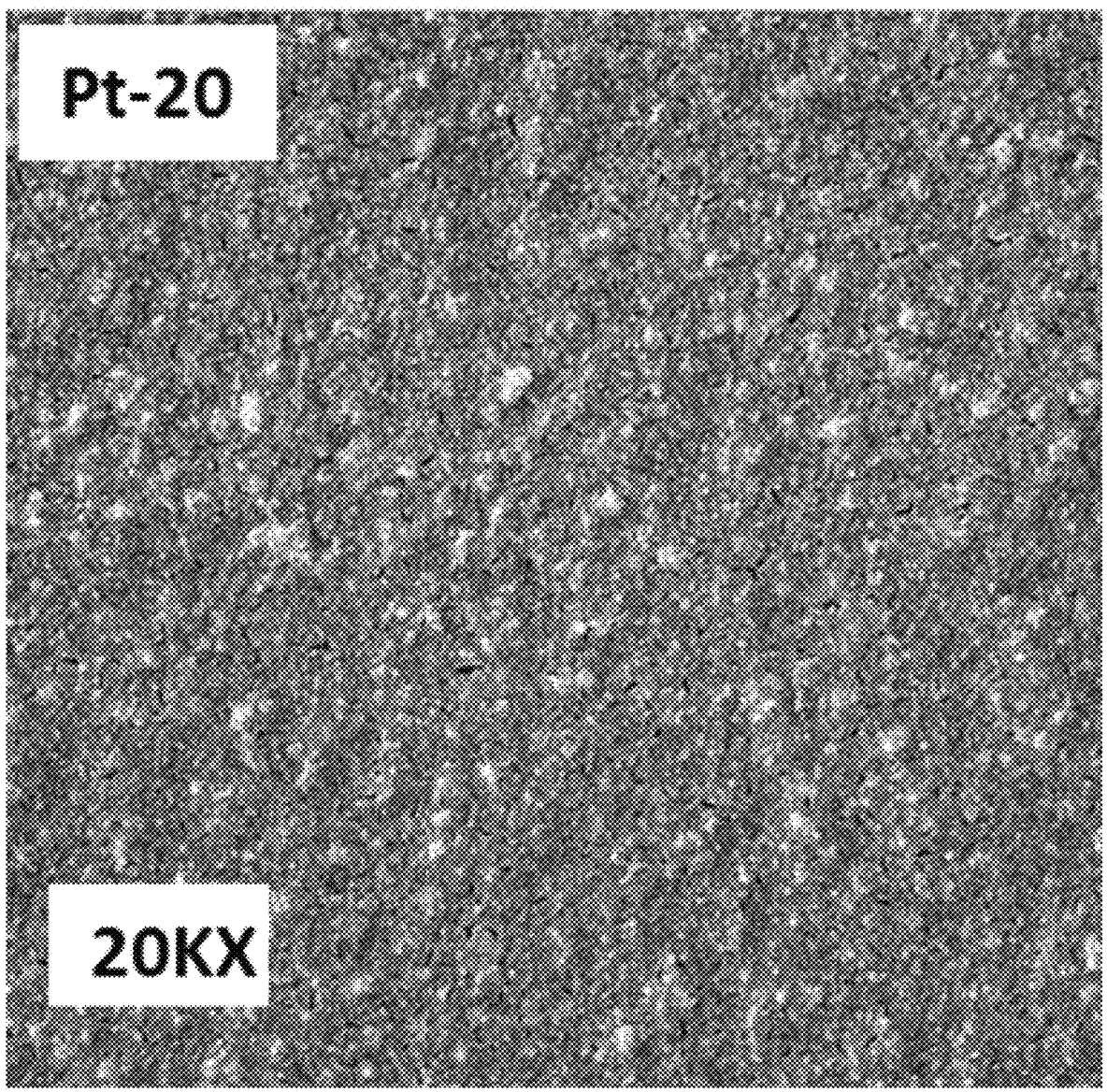
FIGS. 11A to 11C show SEM images of palladium thin films deposited from precursor [Pt($S_2$CN$Bn_2$)$_2$]·py (2) for 20 minute of deposition time at difference magnifications.
Figure 11B:
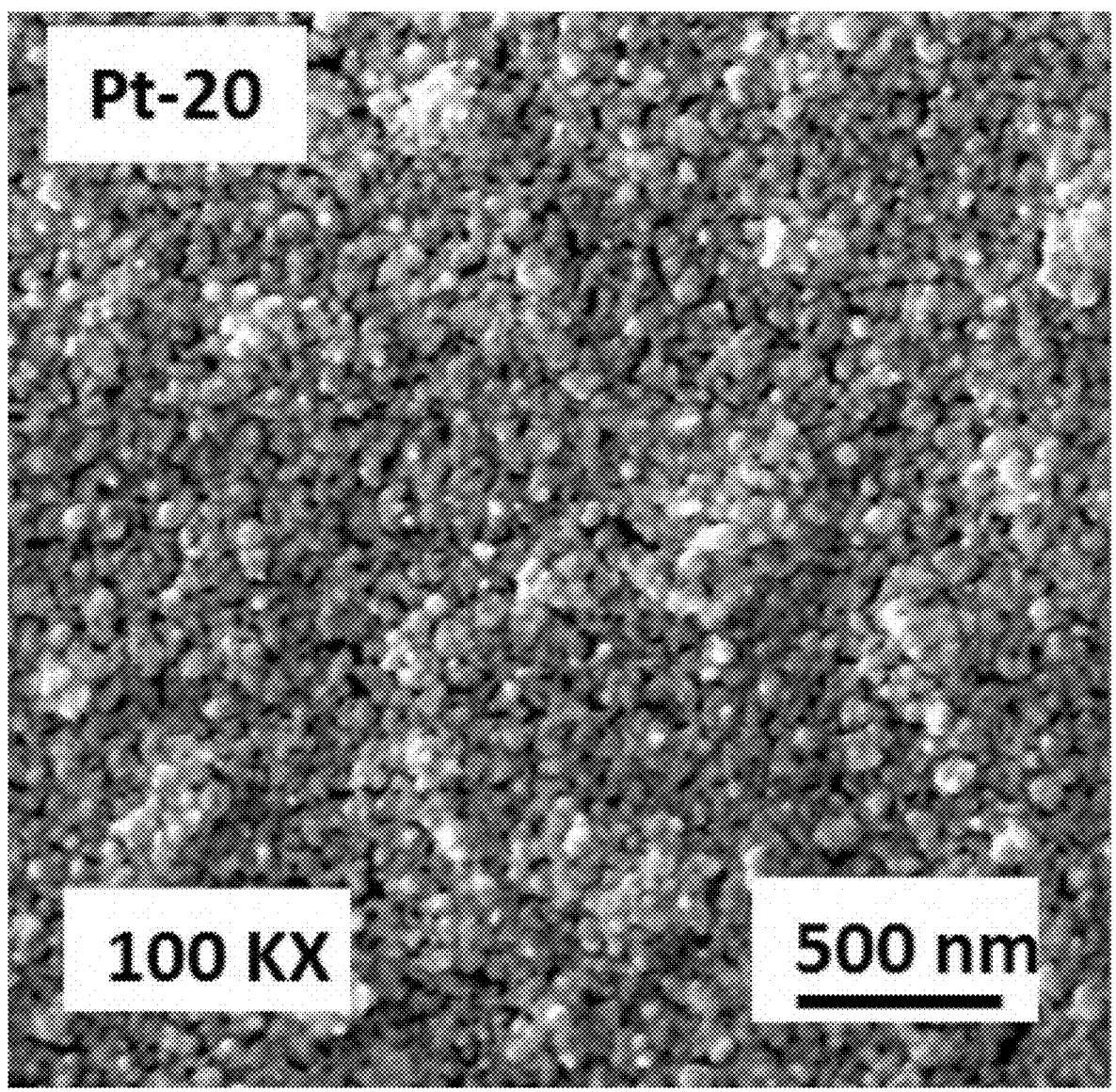
Figure 11C:
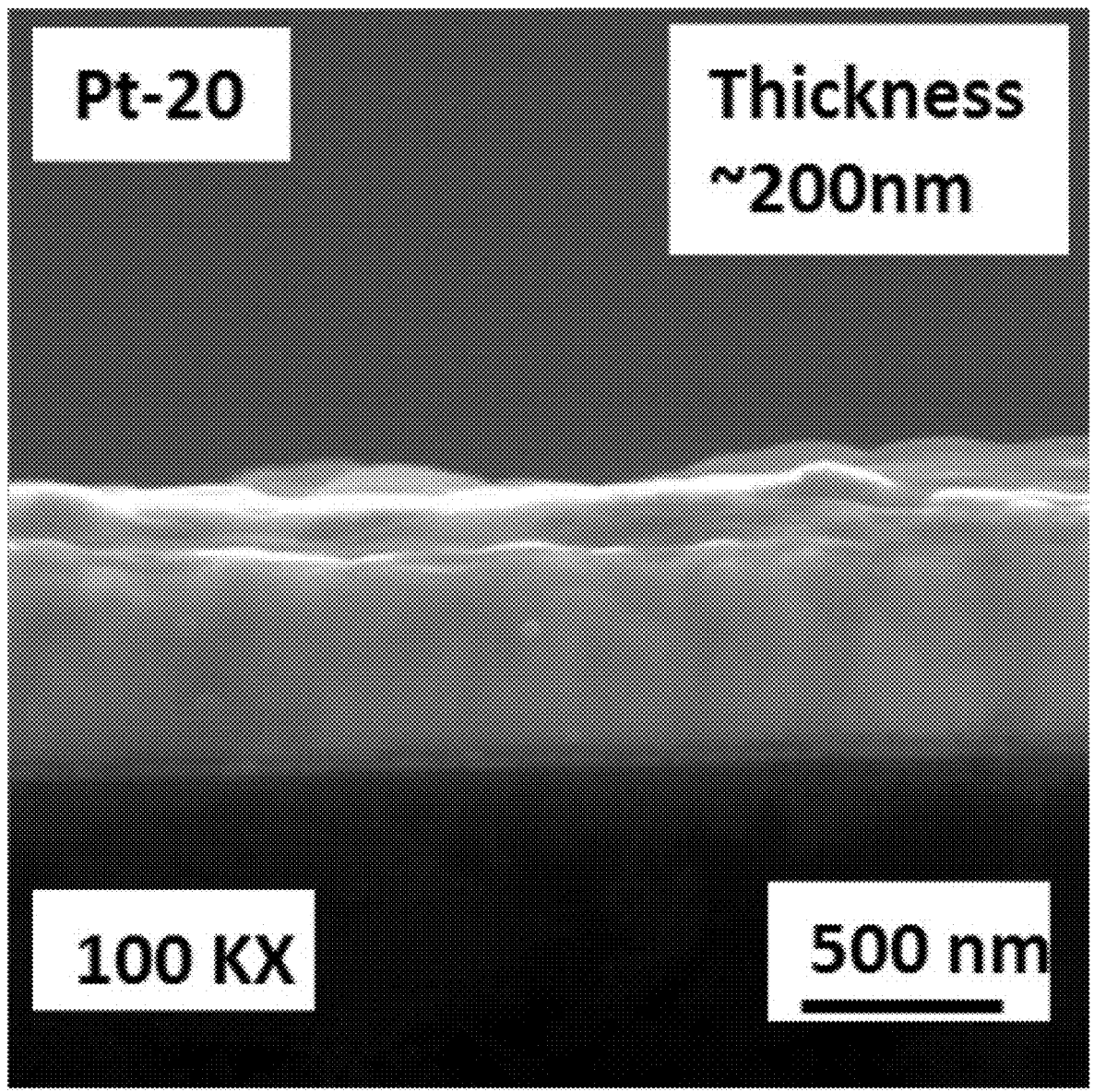

As seen in FIG. 11A to 11C, after a deposition time of 20 minutes, the coalescing of the Pt-material is advanced, leading to a completely homogenous metal film with no exclusive agglomeration or empty spaces. The film thickness in FIG. 11C reaches 200 nm with no visible cracks. Comparing FIG. 11C to the 30 minute deposition in FIG. 6C, it is apparent that the growth rate of the films increases substantially, possibly exponentially, in the time period between 20 and 30 minutes of deposition. The non-linear (increased) growth from the 20th to 30th minute of deposition is likely because of the increased concentration of available atomic nuclei. The increased growth rate allows the film to grow from 200 nm at 20 minutes to reach a thickness of 600 nm at 30 minutes. However, the growth acceleration appears to cause some hairline cracks to arise in the thicker metal film in FIG. 6C. As a result, the connectivity and conductivity decreases from 20 to 30 minutes of deposition.

Figure 12:
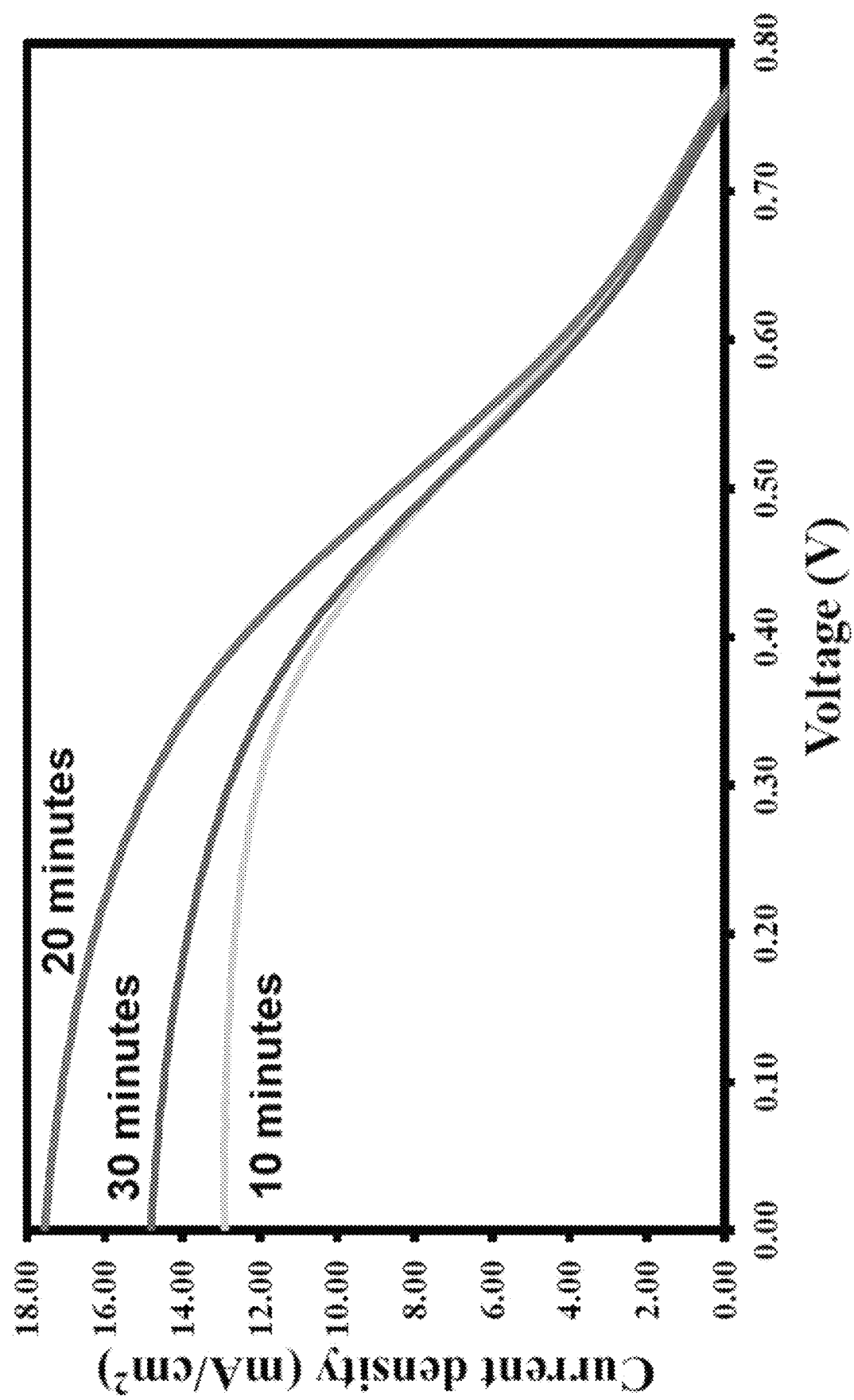
FIG. 12 shows current-voltage characteristics of fabricated DSSC with Pt($S_2$CN$Bn_2$)$_2$]·py (2) at different deposition times.

FIG. 12 shows a plot of data from all three of the time-controlled Pt-films, applied as counter electrodes in DSSCs, corresponding to the photovoltaic performance data in Table 4.

TABLE 4

Photovoltaic properties of DSSC from [Pt(S$_2$CNBn$_2$)$_2$]•py with varied thickness.

| Cell Structure | $J_{sc}$ (mA/cm$^2$) | $V_{oc}$ (mV) | FF | η (%) | $R_s$ | $R_{sh}$ |
|---|---|---|---|---|---|---|
| TiO$_2$/N719/ Pt (10 min.) | 12.90 | 764 | 0.425 | 4.18 | 167 | 9812 |
| TiO$_2$/N719/ Pt (20 min.) | 17.55 | 764 | 0.371 | 4.97 | 170 | 855 |
| TiO$_2$/N719/ Pt (30 min.) | 13.34 | 765 | 0.423 | 4.32 | 168 | 3485 |

Table 4 indicates that the open circuit potential, $V_{oc}$, for all three films remains the same irrespective of deposition time. However, $R_{sh}$ values for 10 and 30 minute depositions are higher than the 20 minute deposition. As a result, the value of fill factor, FF, is also smaller for the 20 minute deposition film compared to the 10 and 30 minute deposition films, providing the highest efficiency of 4.97% with a current density of 17.55 mA/cm$^2$. The catalytic efficiency and current density values of the 20 minute deposition are even higher than the commercial configuration.

These results appear to correspond to the surface characteristics of the film. Higher surface connectivity and homogeneity correlate to higher conductivity and catalytic efficiency in the film. Visual inspection of the films also supports this hypothesis, as films deposited for 20 minutes show a mirror-like surface with high reflectivity, whereas 10 minute depositions provide a duller surface, and 30 minute depositions generates a rougher surface. The enhancement in short circuit current and efficiency in the film from the 20 minute deposition may, therefore, be attributed to at least two factors. A first factor may be the suppression of charge recombination due to better catalytic activity and better morphology of the counter electrode surface. A second factor may be the enhancement due to the more reflective property of the counter electrode film. Greater reflectivity in the counter electrode can make more photons available for the excitation of the dye. Hence, more photoelectrons would be generated and ultimately available for collection by the outer circuit.

Accordingly, the inventive Pt-dithiocarbamate precursors show promising efficiency for DSSC applications, and particularly for manufacturing methods using AACVD to prepare platinum counter electrodes, with low thickness, e.g., at least 175, 180, 185, 190, 195, 197.5, 200, 202.5, 205, 210, 215, 220, 225, 230, 235, 240, 245, 250, 275, 300, 325, or 350 nm and/or up to 600, 575, 550, 525, 500, 475, 450, 425, 400, 390, 385, 380, 375, 370, 365, 360, 355, or 350 nm, and ideal morphology, e.g., without fissures, grooves, unfilled grains, and/or conductor-free (and/or Pt-free) volumes. Such counter electrodes may be suitable for DSSC fabrication on large scale, as well as for other applications using Pt-film electrodes.

Numerous modifications and variations of the present invention are possible in light of the above teachings. It is therefore to be understood that within the scope of the appended claims, the invention may be practiced otherwise than as specifically described herein.

The invention claimed is:

1. An aerosol assisted chemical vapor deposition method for depositing a platinum layer onto a substrate, the method comprising:
   heating the substrate to a deposition temperature above 150° C. in a reactor; and
   introducing into the reactor, at the deposition temperature, an aerosol comprising a platinum dithiocarbamate compound, salt, and/or solvate thereof, at a deposition temperature in a range of 350 to 600° C., to thereby deposit the platinum layer on the substrate,
   wherein the platinum dithiocarbamate compound is of formula (Ib):

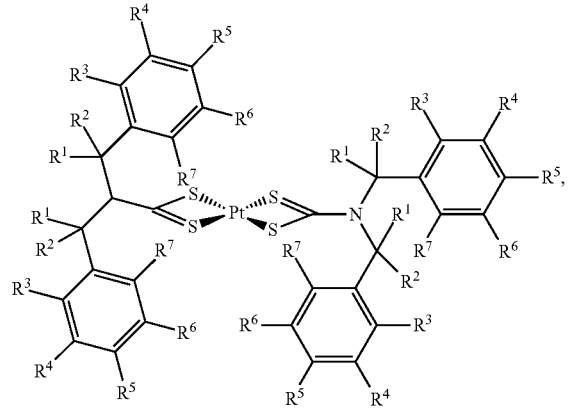

wherein $R^1$ and $R^2$ are independently hydrogen or C1 to C3 alkyl, and
   wherein $R^3$ to $R^7$ are independently hydrogen, $C_{0-3}$-alkyl-halide, $C_{1-5}$-alkyl, $C_{0-3}$alkyl-alcohol, $C_{0-3}$-alkyl-thiol, $C_{0-3}$-alkyl-amine, $C_{0-3}$-alkyl-carboxylate, $C_{0-3}$-alkyl-nitrile, $C_{0-3}$-alkyl-thiocyanate, $C_{0-3}$-alkyl-isocyanate, $C_{0-3}$-alkyl-cyanate, $C_{0-3}$-alkyl-O—$C_{1-5}$alkyl, $C_{0-3}$-alkyl-CO$_2$—$C_{1-5}$-alkyl, $C_{0-3}$-alkyl-O$_2$C—$C_{1-5}$alkyl, $C_{0-3}$-alkyl-N—($C_{1-5}$-alkyl)$_2$, $C_{0-3}$-alkyl-C(O)N—($C_{1-5}$-alkyl)$_2$, $C_{0-3}$-alkyl-C(O)—$C_{1-5}$-alkyl, or $C_{0-3}$-alkyl-S—$C_{1-5}$-alkyl
   wherein the platinum layer formed has a thickness in a range of at least 350 nm after 30 minutes of deposition time, and
   wherein the platinum layer comprises at least 90 wt. % of elemental Pt, based on total deposition layer weight.

2. The method of claim 1, wherein the substrate is a glass.

3. The method of claim 1, wherein the thickness of the platinum layer is in a range of from 350 to 675 nm.

4. The method of claim 1, wherein the thickness of the platinum layer is in a range of from 350 to 600 nm.

5. The method of claim 1, wherein the deposition time is in a range of from 15 to 60 minutes.

6. The method of claim 1, wherein, in the platinum dithiocarbamate compound formula (Ib), $R^1$ and $R^2$ are independently C1 to C3 alkyl.

7. The method of claim 1, wherein the deposition temperature is in a range of 350 to 550° C.

8. The method of claim 1, wherein the deposition temperature is in a range of 450 to 510° C.

9. The method of claim 1, wherein the platinum layer comprises at least 97.5 wt. % of elemental Pt, based on the total deposition layer weight.

10. The method of claim 1, wherein the introducing comprises flowing the aerosol with an inert gas comprising $N_2$, Ar, He, and/or Ne, from an aerosolization vessel to the reactor.

11. The method of claim 10, wherein the inert gas is flowed through the deposition apparatus at a flow rate in a range of from 80 to 160 mL/minutes per 2 $cm^2$ of substrate surface.

12. The method of claim 1, further comprising, prior to the introducing:
aerosolizing a solution or suspension of the platinum dithiocarbamate in an organic solvent comprising at least 90 wt. % of an organic base, based on total solvent weight.

13. The method of claim 12, wherein a weight ratio of the platinum dithiocarbamate to the solvent is in a range of from 25:1 to 250:1.

14. The method of claim 1, wherein the platinum film comprises at least partially fused platinum nanoparticles having average diameters in a range of from 5 to 100 nm uniformly distributed on a surface of the substrate.

15. The method of claim 1, wherein the platinum dithiocarbamate compound comprises $Pt(S_2CN\text{-}i\text{-}Bu_2)_2$.

16. The method of claim 1, wherein the platinum dithiocarbamate compound comprises $Pt(S_2CNBn_2)_2$.

17. The method of claim 1, wherein the deposition temperature is in a range of 350 to 550° C.,
wherein the deposition time is in a range of from 20 to 40 minutes, and
wherein the platinum layer comprises at least 99 wt. % of elemental Pt, based on the total deposition layer weight.

18. The method of claim 1, wherein the thickness of the platinum layer formed is at least 450 nm after 30 minutes of deposition time.

19. The method of claim 17, wherein the thickness of the platinum layer formed is at least 450 nm after 30 minutes of deposition time.

20. The method of claim 1, wherein, in the platinum dithiocarbamate compound of formula (Ib), $R^1$ and $R^2$ are H.

* * * * *